United States Patent
Park et al.

(10) Patent No.: US 9,559,124 B2
(45) Date of Patent: Jan. 31, 2017

(54) DISPLAY PANEL

(71) Applicant: Samsung Display Co., Ltd., Yongin, Gyeonggi-Do (KR)

(72) Inventors: Eun-Kil Park, Cheonan-si (KR); Hyun-Ho Kang, Ansan-si (KR)

(73) Assignee: Samsung Display Co., Ltd. (KR)

( * ) Notice: Subject to any disclaimer, the term of this patent is extended or adjusted under 35 U.S.C. 154(b) by 186 days.

(21) Appl. No.: 14/340,412

(22) Filed: Jul. 24, 2014

(65) Prior Publication Data

US 2015/0187800 A1 Jul. 2, 2015

(30) Foreign Application Priority Data

Dec. 27, 2013 (KR) .................. 10-2013-0165578

(51) Int. Cl.
| | | |
|---|---|---|
| H01L 29/12 | (2006.01) | |
| H01L 27/12 | (2006.01) | |
| H01L 29/786 | (2006.01) | |
| G02F 1/1362 | (2006.01) | |

(52) U.S. Cl.
CPC ....... H01L 27/124 (2013.01); G02F 1/136209 (2013.01); H01L 27/1259 (2013.01); H01L 29/7869 (2013.01); *G02F 2203/09* (2013.01)

(58) Field of Classification Search
CPC ............... G02F 1/133512; G02F 1/136209
USPC .................................................. 257/40, 43
See application file for complete search history.

(56) References Cited

U.S. PATENT DOCUMENTS

| | | | |
|---|---|---|---|
| 6,466,281 B1 | 10/2002 | Huang et al. | |
| 6,603,518 B1 | 8/2003 | Miyamoto et al. | |
| 8,212,976 B2 | 7/2012 | Park | |
| 8,253,891 B2 | 8/2012 | Yu et al. | |
| 8,268,412 B2 | 9/2012 | Yang et al. | |
| 2011/0085103 A1 | 4/2011 | Yang et al. | |
| 2013/0107182 A1 | 5/2013 | Hagiwara et al. | |
| 2013/0114126 A1 | 5/2013 | Kim et al. | |
| 2013/0271690 A1* | 10/2013 | Matsukizono | H01L 27/1225 349/46 |
| 2013/0320333 A1* | 12/2013 | Koyama | H01L 27/1461 257/43 |
| 2014/0022479 A1* | 1/2014 | Hosaka | G02F 1/1368 349/43 |

FOREIGN PATENT DOCUMENTS

| | | |
|---|---|---|
| KR | 10-2005-0053092 | 6/2005 |
| KR | 10-2006-0112042 | 10/2006 |
| KR | 10-2007-0038824 | 4/2007 |

(Continued)

Primary Examiner — Dung Le
(74) Attorney, Agent, or Firm — Innovation Counsel LLP

(57) ABSTRACT

A display panel includes a first base substrate that includes an upper surface to which an external light is incident and a lower surface facing the upper surface and includes a plurality of pixel areas and a peripheral area adjacent to the pixel areas when viewed in a plan view, a plurality of pixels disposed on the lower surface of the first base substrate to respectively correspond to the pixel areas, and a black matrix layer disposed between the pixels and the lower surface of the first base substrate to overlap the peripheral area. The black matrix layer includes a low reflection layer disposed on the lower surface of the first base substrate and a light blocking layer disposed on the low reflection layer.

16 Claims, 18 Drawing Sheets

(56) References Cited

FOREIGN PATENT DOCUMENTS

| KR | 10-2008-0043417 | 5/2008 |
| KR | 10-2008-0080772 | 9/2008 |
| KR | 10-2013-0019744 | 2/2013 |
| KR | 10-2013-0058511 | 4/2013 |

* cited by examiner

DISPLAY PANEL

CROSS-REFERENCE TO RELATED APPLICATION

This U.S. non-provisional patent application claims priority under 35 U.S.C. §119 of Korean Patent Application No. 10-2013-0165578, filed on Dec. 27, 2013, the contents of which are hereby incorporated by reference in its entirety.

BACKGROUND

1. Field of Disclosure

The present disclosure relates to a display panel and a method of manufacturing the same. More particularly, the present disclosure relates to a display panel including a low reflection black matrix and a method of manufacturing the display panel.

2. Description of the Related Art

A flat panel display device has been developed to replace a cathode ray tube display device with thick thickness and high power consumption. As the flat panel display device, various display devices, such as an organic light emitting display device, a liquid crystal display device, a plasma display panel device, etc., are widely used.

Each display device includes pixels and signal lines to apply signals to the pixels. Each pixel includes a thin film transistor connected to a corresponding signal line of the signal lines.

Each pixel is driven in response to a data voltage provided through the corresponding signal line, and thus a desired image is displayed.

SUMMARY

The present disclosure provides a display panel including a low reflection black matrix and having improved adhesive strength between a seal pattern and a display substrate.

The present disclosure provides a method of manufacturing the display panel.

Embodiments of the inventive concept provide a display panel including a first base substrate that includes an upper surface to which an external light is incident and a lower surface facing the upper surface and includes a plurality of pixel areas and a peripheral area adjacent to the pixel areas when viewed in a plan view, a plurality of pixels disposed on the lower surface of the first base substrate to respectively correspond to the pixel areas, and a black matrix layer disposed between the pixels and the lower surface of the first base substrate to overlap the peripheral area. The black matrix layer includes a low reflection layer disposed on the lower surface of the first base substrate and a light blocking layer disposed on the low reflection layer.

The light blocking layer includes a metal material.

The black matrix layer has a reflectivity of about 1.8% to about 3.8% with respect to the external light.

The low reflection layer includes a metal oxide obtained from the metal material included in the light blocking layer.

The light blocking layer includes chromium and the low reflection layer comprises a chromium oxide.

The light blocking layer includes copper or titanium and the low reflection layer comprises at least one of indium oxide, gallium oxide, zinc oxide, and any combination thereof.

The display panel further includes a plurality of signal lines disposed in the peripheral area. Each of the pixels includes a thin film transistor connected to a corresponding signal line of the signal lines, and a pixel electrode connected to the thin film transistor through a contact hole formed through an inner layer that covers the thin film transistor and the black matrix layer further overlaps with the thin film transistor.

The display panel further includes a second base substrate disposed to be spaced apart from the lower surface of the first base substrate, and a common electrode disposed on the second base substrate.

The common electrode is disposed directly on the second base substrate.

The display panel further includes at least one spacer. The first base substrate includes a display area that includes the pixel areas and the peripheral area and a non-display area surrounding the display area. The spacer is disposed between the first base substrate and the second base substrate to overlap with the peripheral area, attached to the inner layer, and makes contact with the common electrode.

The inner layer includes a color filter layer.

The display panel further includes a liquid crystal layer disposed between the first base substrate and the second base substrate, and a sealing member disposed to overlap with the non-display area, to couple the first base substrate and the second base substrate, and to seal the liquid crystal layer.

The inner layer includes a color filter layer and an insulating layer which is disposed between the color filter layer and the pixel electrode.

The display panel further includes a light blocking control electrode disposed on the inner layer to overlap with the peripheral area, receiving a same voltage as the common electrode, and controlling an alignment of liquid crystal molecules of the liquid crystal layer, which are disposed in the peripheral area, to define a light blocking area.

The light blocking control electrode includes a same material as that of the pixel electrode.

The signal lines includes a plurality of gate lines each of which is connected to a gate electrode of a corresponding thin film transistor, and a plurality of data lines each of which is connected to a source electrode of a corresponding thin film transistor, and the light blocking control electrode overlaps the data lines.

The display panel further includes a light blocking control electrode disposed on the inner layer to overlap peripheral area, the light blocking control electrode receiving a same voltage as the common electrode to define a light blocking area.

The light blocking control electrode includes a material same as a material which the pixel electrode includes.

Embodiments of the inventive concept provide a method of manufacturing a display panel which includes forming a black matrix layer on a surface of a first base substrate including at least one pixel area and a peripheral area adjacent to the pixel area, forming at least one pixel on the black matrix layer to overlap with the pixel area, forming a common electrode on a second base substrate, and coupling the first base substrate and the second base substrate. The forming of the black matrix layer includes forming a low-reflection material layer on the first base substrate, forming a metal layer on the low-reflection material layer, and patterning the low-reflection material layer and the metal layer to form the black matrix layer overlapping the peripheral area.

The method of manufacturing a display panel further includes forming a plurality of signal lines on the black matrix layer to overlap the peripheral area. The forming at least one pixel includes forming a thin film transistor on the black matrix layer to be connected to the signal lines, and forming a pixel electrode on the thin film transistor such that the pixel electrode is electrically connected to the thin film transistor. The black matrix layer overlaps the thin film transistor.

The method of manufacturing a display panel further includes forming a color filter layer disposed between the pixel electrode and the thin film transistor. The coupling of the first base substrate and the second base substrate includes disposing the first base substrate such that the surface of the first base substrate faces an upper surface of the second base substrate, disposing a sealing member between the first base substrate and the second base substrate, and irradiating a light onto a lower surface of the second base substrate, which faces the upper surface of the second base substrate, to cure the sealing member, and the common electrode makes contact with the upper surface of the second base substrate.

The method of manufacturing a display panel further includes forming a light blocking control electrode disposed on the color filter layer in the peripheral area, wherein the light blocking control electrode is substantially simultaneously patterned with the pixel electrode and formed on an area corresponding to data lines.

According to the above, since the color filter layer and the black matrix layer are disposed on an array substrate and the black matrix layer is not disposed on an opposite substrate facing the array substrate, an organic layer required to planarize the black matrix layer may be omitted. Accordingly, the common electrode disposed on the opposite substrate is adhered to the upper surface of the substrate and the adhesive strength of the sealing member used to couple the substrates is improved, and thus moisture may be prevented from penetrating in to an interface between the sealing member and the common electrode or between the common electrode and the substrate.

In addition, the black matrix layer is buried in the base substrate and the elements of the array substrate, but has the low reflection characteristic. Therefore, the visibility of the display panel may be improved even though the black matrix layer including the metal material is used.

BRIEF DESCRIPTION OF THE DRAWINGS

The above and other advantages of the present disclosure will become readily apparent with reference to the following detailed description when considered in conjunction with the accompanying drawings wherein.

DETAILED DESCRIPTION

Figure 1:
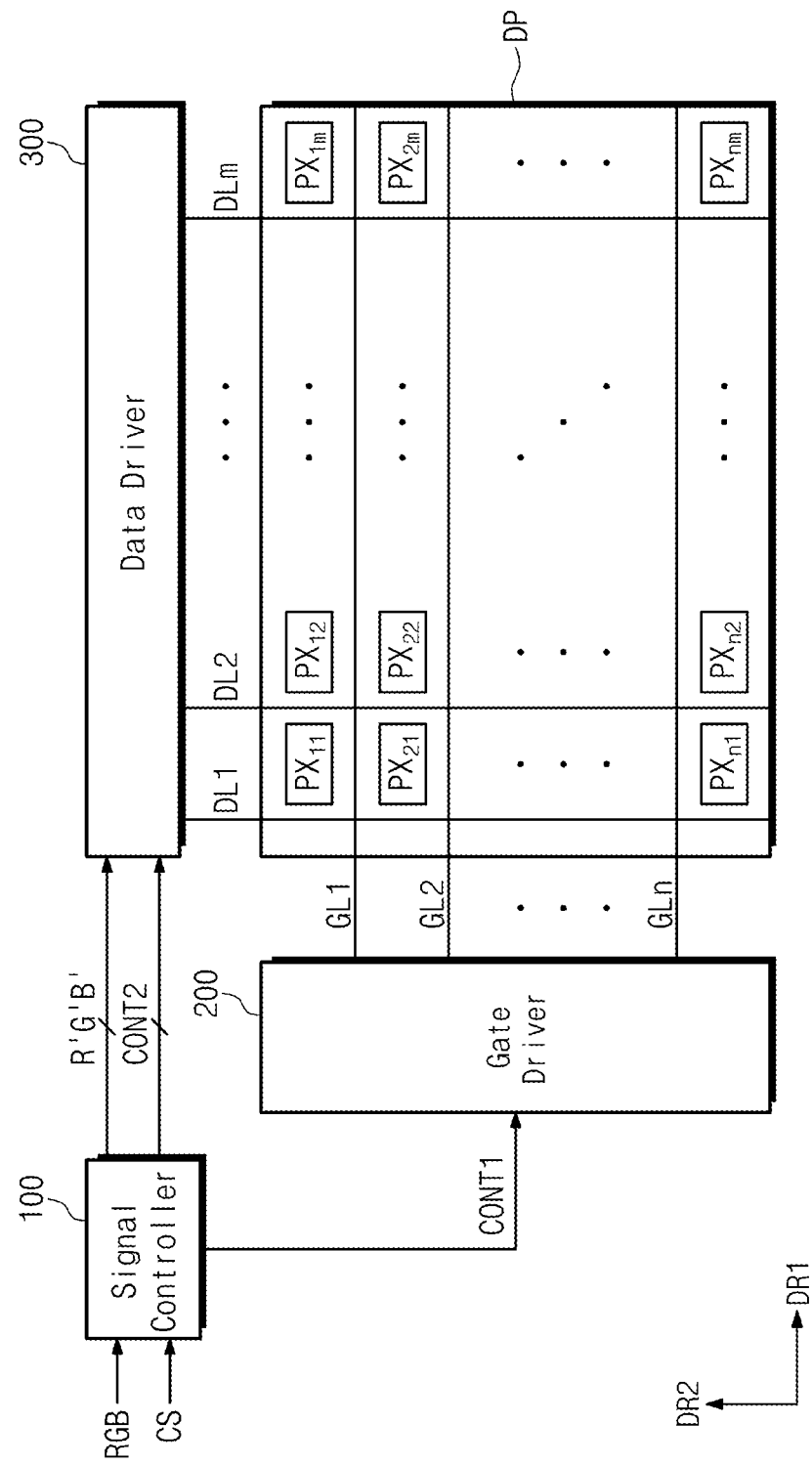
FIG. 1 is a block diagram showing a display device according to an exemplary embodiment of the present disclosure.

It will be understood that when an element or layer is referred to as being "on", "connected to" or "coupled to" another element or layer, it can either be formed directly on, connected or coupled to the other element or layer, or formed with intervening elements or layers. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, the described elements, components, regions, layers and/or sections are not limited by the terms used. The terms are only used to distinguish one element, component, region, layer or section from another region, layer or section. Thus, a first element, component, region, layer or section discussed below could be termed a second element, component, region, layer or section without departing from the teachings of the present disclosure.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features may then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to limit the inventive concept. As used herein, the singular forms, "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Hereinafter, the inventive concept will be explained in detail with reference to the accompanying drawings.

FIG. 1 is a block diagram showing a display device according to an exemplary embodiment of the present disclosure.

Referring to FIG. 1, a display device DS includes a signal controller 100, a gate driver 200, a data driver 300, and a display panel DP.

The signal controller 100 receives input image signals RGB and converts the input image signals RGB to image data R'G'B' appropriate to an operation of the display panel DP. In addition, the signal controller 100 receives various control signals CS, such as a vertical synchronization signal, a horizontal synchronization signal, a main clock signal, a data enable signal, etc., and outputs first and second control signals CONT1 and CONT2.

The gate driver 200 outputs gate signals in response to the first control signal CONT1. The first control signal CONT1 includes a vertical start signal to start an operation of the gate driver 200, a gate clock signal to determine an output timing of a gate voltage, and an output enable signal to determine an ON pulse width of the gate voltage.

The data driver 300 receives the second control signal CONT2 and the image data R'G'B'. The data driver 300 converts the image data R'G'B' to data voltages and applies the data voltages to the display panel DP.

The second control signal CONT2 includes a horizontal start signal to start an operation of the data driver 300, an inversion signal to invert a polarity of the data voltages, and an output indicating signal to determine an output timing of the data voltages.

The display panel DP includes a plurality of signal lines and a plurality of pixels PX11 to PXnm connected to the signal lines. The signal lines include a plurality of gate lines GL1 to GLn and a plurality of data lines DL1 to DLm.

The gate lines GL1 to GLn extend in a first direction DR1 and are arranged in a second direction DR2 crossing the first direction DR1. The gate lines GL1 to GLn receive the gate signals from the gate driver 200 and apply the gate signals to the pixels PX11 to PXnm.

The data lines DL1 to DLm extend in the second direction DR2 and are insulated from the gate lines GL1 to GLn while crossing the gate lines GL1 to GLn. The data lines DL1 to DLm receive the data voltages from the data driver 300.

The pixels PX11 to PXnm are arranged in a matrix form. Each of the pixels PX11 to PXnm is connected to a corresponding gate line of the gate lines GL1 to GLn and a corresponding data line of the data lines DL1 to DLm.

The display panel DP may be a liquid crystal display panel, an organic light emitting display panel, an electrophoretic display panel, or an electro wetting display panel. In the present exemplary embodiment, the liquid crystal display device including the liquid crystal display panel will be described as the display panel DP.

The liquid crystal display device further includes a backlight unit (not shown) supplying a light to the display panel DP and a pair of polarizing plates (not shown). The liquid crystal display panel DP may be operated as a vertical alignment (VA) mode, a patterned vertical alignment (PVA) mode, an in-plane switching (IPS) mode, a fringe-field switching (FFS) mode, or a plane to line switching (PLS) mode. In the present exemplary embodiment, the display panel DP operated as the VA mode will be described as a representative example.

Figure 2:
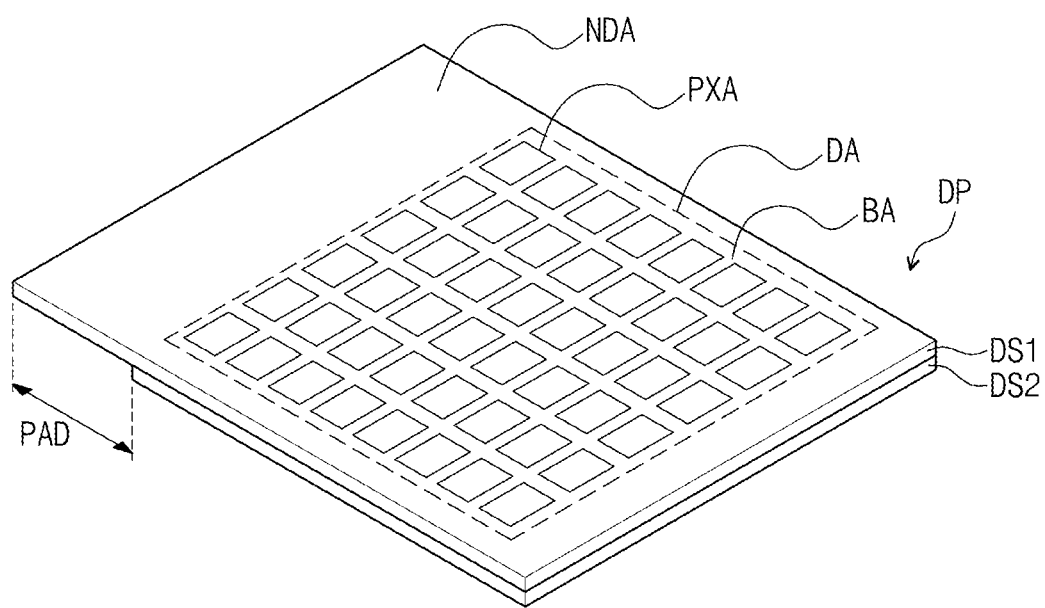
FIG. 2 is a perspective view showing a display panel shown in FIG. 1.

FIG. 2 is a perspective view showing the display panel DP shown in FIG. 1.

Referring to FIG. 2, the display panel DP includes a first display substrate DS1 and a second display substrate DS2, which are spaced apart from each other. Although not shown in figures, the display panel DP further includes a liquid crystal layer interposed between the first display substrate DS1 and the second display substrate DS2.

The gate lines GL1 to GLn, the data lines DL1 to DLm, and the pixels PX11 to PXnm are disposed on the first display substrate DS1 disposed at a relatively upper portion among the first and second display substrates DS1 and DS2. The second display substrate DS2 is spaced apart from the first display substrate DS1 in a thickness direction DR3 (hereinafter, referred to as a third direction) substantially perpendicular to the first and second directions DR1 and DR2. According to another embodiment, however, the gate lines GL1 to GLn, the data lines DL1 to DLm, and the pixels PX11 to PXnm may be disposed on the second display substrate DS2.

The first display substrate DS1 includes a display area DA and a non-display area NDA. The image is displayed in the display area DA. The display area DA includes a plurality of pixel areas PXA and a peripheral area BA.

The pixels PX11 to PXnm are respectively disposed in the pixel areas PXA of the display area DA. The pixel areas PXA are spaced apart from each other. In the present exemplary embodiment, the pixels PX11 to PXnm are disposed on the first display substrate DS1, but it should not be limited thereto or thereby. The pixels PX11 to PXnm may be disposed on the second display substrate DS2 according to embodiments.

The peripheral area BA is disposed adjacent to the pixel areas PXA when viewed in a plan view. The peripheral area BA is disposed between the pixel areas PXA to have a lattice shape. The gate lines GL1 to GLn and the data lines DL1 to DLm are disposed in the peripheral area BA.

The non-display area NDA does not display the image. The non-display area NDA surrounds the display area DA when viewed in a plan view. A pad area PAD is disposed at a position adjacent to one side of the non-display area NDA. The pad area PAD of the first display substrate DS1 does not overlap the second display substrate DS2. The signal controller 100, the gate driver 200, or the data driver 300 are directly disposed in the pad area PAD, or connected to the pad area PAD after being mounted on a separate circuit board.

The second display substrate DS2 is disposed to be spaced apart from the first display substrate DS1 in the thickness direction DR3. The second display substrate DS2 may have an area smaller than that of the first display substrate DS1. The second display substrate DS2 is formed of a transparent material to allow the light to travel to the first display substrate DS1.

Although not shown in figures, the display panel DP further includes the polarizing plates respectively disposed on an upper surface of the first display substrate DS1 and a lower surface of the second display substrate DS2.

Although not shown in figures, the backlight unit (not shown) is disposed under the second display substrate DS2. The light provided from the backlight unit sequentially transmits through the second display substrate DS2 and the first display substrate DS1, and then the light is perceived by a user. Hereinafter, the structure of the display panel DP will be described in detail.

Figure 3A:
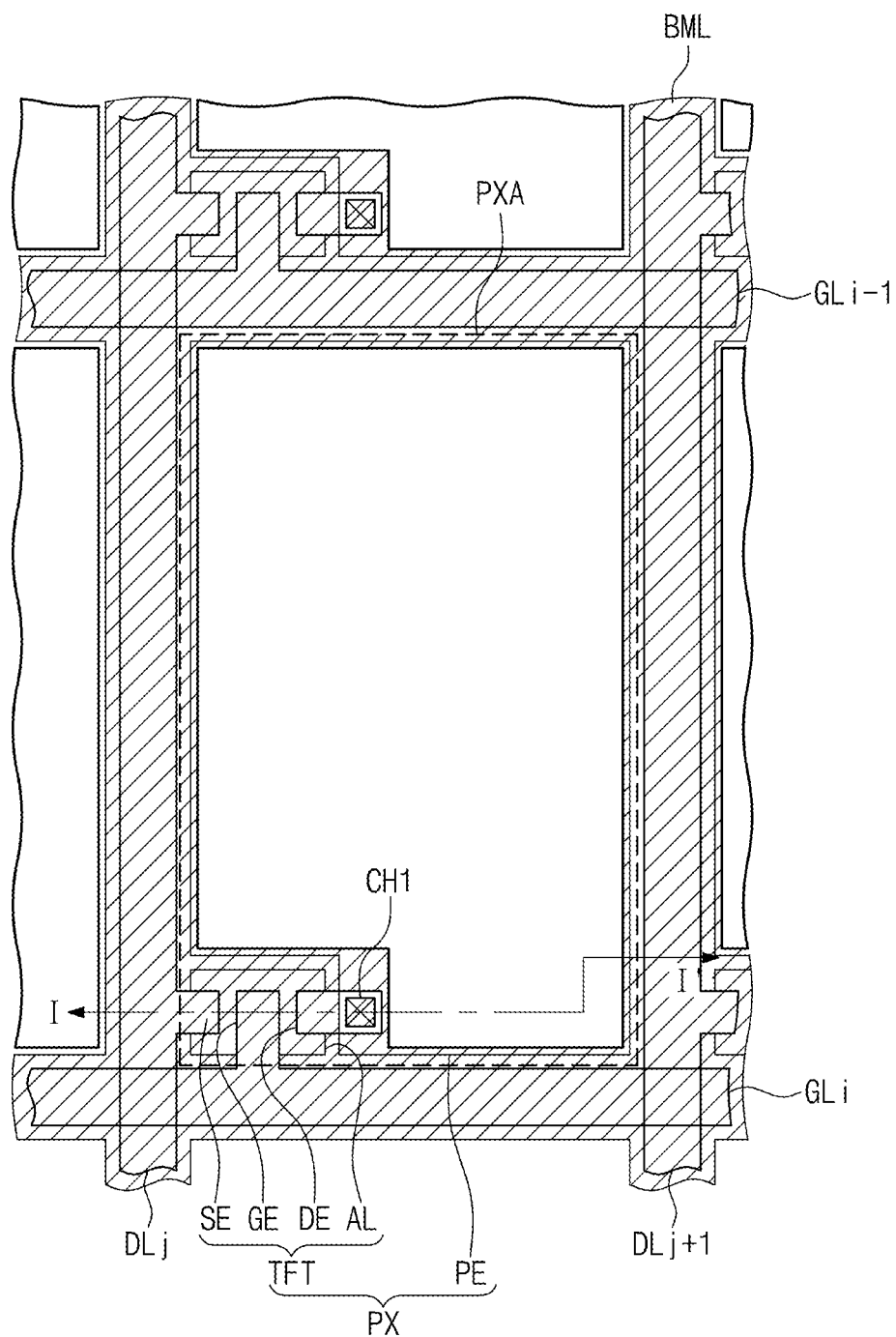
FIG. 3A is a plan view showing a portion of a display panel according to an exemplary embodiment of the present disclosure.
Figure 3B:
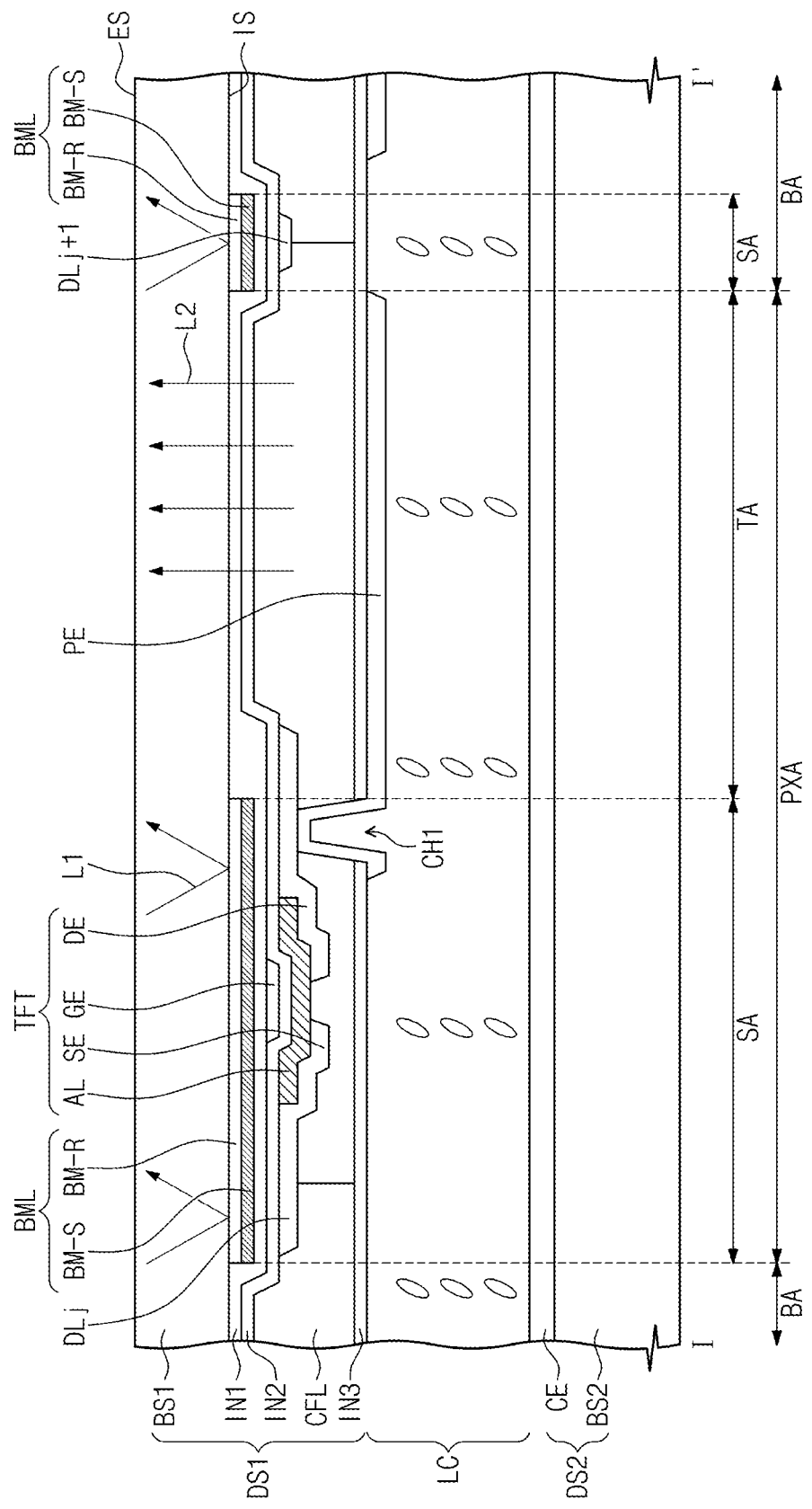
FIG. 3B is a cross-sectional view taken along a line I-I' of FIG. 3A.

FIG. 3A is a plan view showing a portion of a display panel according to an exemplary embodiment of the present disclosure and FIG. 3B is a cross-sectional view taken along a line I-I' of FIG. 3A. FIG. 3A shows one pixel area. The structure of the display panel DP in the display area DA will be described in detail with reference to FIGS. 3A and 3B.

Referring to FIG. 3A, the pixel areas PXA are spaced apart from each other and the peripheral area BA is disposed between the pixel areas PXA. Each of the pixel areas PXA includes a corresponding pixel PX of the pixels PX11 to PXnm disposed therein.

Referring to FIGS. 3A and 3B, the first display substrate DS1 includes a first base substrate BS1 and the pixel PX disposed on the first base substrate BS1. A black matrix layer BML is disposed between the first base substrate BS1 and the pixel PX.

The first base substrate BS1 includes an upper surface ES and a lower surface IS, which face each other. An external light is incident on the upper surface ES and an internal light is incident on the lower surface IS. However, according to another embodiment, the internal light may be incident on the upper surface ES.

The external light may be a natural light and the internal light is the light provided from the backlight unit disposed under the display panel DP. A portion of the external light transmits through the first display substrate DS1 and the other portion of the external light is reflected by elements disposed on the lower surface IS after passing through the first base substrate BS1. The first base substrate BS1 may be a transparent substrate, e.g., a glass substrate, a plastic substrate, etc.

The black matrix layer BML is disposed on the lower surface IS of the first base substrate BS1. As shown in FIG. 3A, the black matrix layer BML overlaps the peripheral area BA and extends to overlap a portion of the pixel area PXA. For instance, the black matrix BML overlaps the thin film transistor TFT. In FIG. 3A, the black matrix layer BML overlaps a portion of a pixel electrode PE, but it should not be limited thereto or thereby. That is, the black matrix layer BML may not overlap the pixel electrode PE.

As shown in FIG. 3B, the area in which the black matrix layer BML is disposed serves as a light blocking area SA and the area in which the black matrix layer BML is not disposed serves as a transmitting area TA.

The internal light is blocked by the light blocking area SA and, thus, the internal light is not shown at the light blocking area SA. The light served by the display device DP includes a reflection light L1 and a transmission light L2. The reflection light L1 is external light reflected from the first display substrate DS1, and the transmission light L2 is internal light which passes through the first display substrate DS1.

When the light is incident on the first display substrate DS1, the reflection light L1 is generated in the light blocking area. The internal light travels to the outside of the first display substrate DS1 through the transmitting area TA. Transmission light L2 is the internal light which passes through the transmitting area TA.

Therefore, users may see the reflection light L1 and the transmission light L2. It is preferable to reduce the reflection light L1. The transmission light L2 may have information. The reflection light L1 may reduce visibility of the transmission light L2. Therefore the lower a strength of the reflection light L1 is, the higher the visibility of the transmission light L2 is. Low reflectivity of the light blocking area SA may reduce the strength of the reflection light L1.

The black matrix layer BML blocks the light traveling upward from a lower side of the first base substrate BS1 and lowers the reflectivity of the light traveling downward from an upper side of the first base substrate BS1. The black matrix layer BML includes a low reflection layer BM-R and a light blocking layer BM-S.

The light blocking layer BM-S reflects or absorbs the light incident thereonto block the light. The light blocking layer BM-S includes a metal material. The metal material may be an opaque metal material having low transmittance to block the incident light. For instance, the light blocking layer BM-S includes the metal material having low transmittance and bright color to reflect the light incident thereon, and thus the light is blocked by the light blocking layer BM-S. When the light blocking layer BM-S includes a metal material having low transmittance and dark color, the light blocking layer BM-S absorbs the light incident thereon, thereby blocking the light.

The low reflection layer BM-R is disposed on the lower surface IS of the first base substrate BS1 and disposed between the light blocking layer BM-S and the first base substrate BS1. The low reflection layer BM-R refracts the light incident thereonto reduce the reflectivity. The low reflection layer BM-R lowers the reflectivity of the display panel DP with respect to the external light.

The low reflection layer BM-R has a predetermined refractive index. The low reflection layer BM-R refracts the light incident on the light blocking layer BM-S among the external light to correspond to the refractive index. The light passes through the low reflection layer BM-R is reflected on the surface of the light blocking layer BM-S and is refracted again during it passes through the low reflection layer BM-R. The refracted light is emitted to the outside. The reflectance of the display panel DP with respect to the external light may be controlled by the refractive index of the low reflection layer BM-R and the light blocking layer BM-S.

The refractive index of the low reflection layer BM-R is changed depending on a material used to form the low reflection layer BM-R and a thickness of the low reflection layer BM-R. The low reflection layer BM-R includes a low-reflection material. The low-reflection material reduces the light reflectance at a surface of the light blocking layer BM-S that forms an interface with the low reflection layer BM-R.

The low reflection layer may include a metal material. The low reflection material is changed depending on the metal material included in the light blocking layer BM-S. For instance, the low reflection layer BM-R may include a metal oxide which includes the metal included in the light blocking layer BM-S. The light blocking layer BM-S may include chromium and the low reflection layer BM-R may include chromium oxide.

Alternatively, the light blocking layer BM-S may include copper or titanium and the low reflection layer BM-R may include at least one oxide selected from the group consisting of indium oxide, gallium oxide and zinc oxide, and any combination thereof. For instance, when the light blocking layer BM-S includes copper, the low reflection layer BM-R may include indium zinc oxide (IZO), zinc indium oxide (ZIO), or gallium zinc oxide (GZO).

However, the low reflection layer BM-R should not be limited thereto or thereby. That is, the low reflection layer BM-R may include various low-reflection materials in accordance with the metal material included in the light blocking layer BM-S and may have various thicknesses to reduce the reflectivity of the display panel DP against the external light. Although not shown in figure, each of the light blocking layer BM-S and the low reflection layer BM-R may have a multi-layer structure of two or more material layers.

Hereinafter, the black matrix layer BML according to the present exemplary embodiment will be described in detail with reference to the following Table 1.

TABLE 1

|  | reflectivity | Color coordinate (Wx/Wy) |
|---|---|---|
| SP1 | 1.85 | 0.4315/0.4055 |
| Ti/Cu (SP2) | 3.82 | 0.4630/0.3983 |
| Ti/IZO/Cu (DP) | 2.99 | 0.4533/0.4010 |

Table 1 represents the reflectivity of the display panel DP according to the present exemplary embodiment together with those of comparative examples SP1 and SP2. In Table 1, the first comparative example SP1 represents an experimental data of an organic black matrix layer and the second comparative example SP2 represents an experimental data of a light blocking layer including a copper layer and a titanium layer disposed on the copper layer. The embodiment example DP according to the present exemplary embodiment represents an experimental data of the black matrix layer BML including an indium zinc oxide layer, a titanium layer, and a copper layer. The titanium layer, the indium zinc oxide layer, and the copper layer are sequentially stacked on the first base substrate BS1 to form the black matrix layer BML.

The display panel DP according to the present exemplary embodiment is tested with regard to the first comparative example SP1 as a reference. The materials and thicknesses of the low reflection layer BM-R and the light blocking layer BM-S may be changed to allow the display panel DP to have the reflectivity and the color coordinate, which are approximate to those of the first comparative example SP1.

Table 1 represents a ratio of the reflected light to the light incident onto the black matrix layer at about 400 lux. In addition, the reflectivity of the first comparative example SP1 and the display panel DP represents an average value obtained through experiments and the reflectivity of the second comparative example SP2 represents a lowest value obtained through experiments.

With reference to Table 1, since the display panel DP further includes the low reflection layer BM-R, the reflectivity of the display panel DP is more reduced by about 1% than that of the second comparative example SP2 including only the light blocking layer BM-S. The black matrix layer BML according to the present exemplary embodiment further includes the low reflection layer BM-R, and thus the black matrix layer BML may have the reflectivity approximate to that of the first comparative example SP1.

Further, since the display panel DP further includes the low reflection layer BM-R, a color reproducibility of the display panel DP is improved. When the reflectivity of the display substrate becomes larger, colors represented by the display substrate are shifted to other colors ("discoloration"), or a certain color is emphasized or degraded. Accordingly, when comparing to the color coordinate of the first comparative example SP1 having relatively small reflectivity, dispersion is increased and the color reproducibility is degraded when a difference in color coordinate between x-axis and y-axis becomes larger.

When the color coordinate of each of the display panel DP and the second comparative example SP2 is compared to the first comparative example SP1 with reference to Table 1, a difference in the color coordinate between the display panel DP and the first comparative example SP1 is smaller than a difference in the color coordinate between the second comparative example SP2 and the first comparative example SP1. Therefore, the display panel DP may have the color reproducibility approximate to that of the first comparative example SP1 since the display panel DP further includes the low reflection layer BM-R.

The display panel DP is required to reduce the reflectivity and to improve the color reproducibility. As the thickness of the black matrix BML becomes thin, the reflectivity becomes low, but the color dispersion becomes high. Thus, the display panel DP may include the black matrix layer BML having the controlled reflectivity without lowering visibility and color reproducibility.

For instance, the black matrix layer BML according to the present exemplary embodiment may have the reflectivity of about 1.83% to about 3.8% with respect to the external light. The materials and thicknesses of the low reflection layer BM-R and the light blocking layer BM-S are set to allow the black matrix layer BML to have the reflectivity of about 1.83% to about 3.8% with respect to the external light. In detail, the low reflection layer BM-R includes the metal material having the reflectivity of about 1.83% to about 3.8% with respect to the external light without lowering visibility and color reproducibility.

Referring to FIG. 3A, the black matrix layer BML defines the pixel areas PXA. The black matrix layer BML overlaps the peripheral area BA. At least a portion of the black matrix layer BML extends in the pixel areas. For instance, a portion of the black matrix layer BML covers the thin film transistor TFT. In addition, the black matrix layer BML extends to overlap a portion of the pixel electrode PE connected to the thin film transistor TFT.

The black matrix layer BML blocks the transmission of the internal light and reduces the reflection of the external light. In addition, the black matrix layer BML prevents the light from leaking in areas adjacent to the pixel areas PXA. The black matrix layer BML includes the light blocking layer BM-S and the low reflection layer BM-R, which are stacked one on another, and the black matrix layer BML may block external light incident from different directions. The black matrix layer BML may absorb the light incident on the black matrix layer BML and prevent the light from reflecting from the surface of the black matrix layer BML. Therefore the black matrix layer BML may block the internal light passing through the black matrix layer BML and prevent the light incident on the black matrix layer BML from reflecting.

As shown in FIGS. 3A and 3B, a portion of the pixel PX is disposed on the black matrix layer BML. The pixel PX is connected to the corresponding gate line GLi of the gate lines GLi-1 and GLi and the corresponding data line DLj of the data lines DLj and DLj+1. The pixel PX includes the thin film transistor TFT and the pixel electrode PE.

The thin film transistor TFT includes a gate electrode GE, a source electrode SE, a drain electrode DE, and a semiconductor layer AL. The gate electrode GE is connected to the corresponding gate electrode GE.

The gate electrode GE includes the same material as that of the gate line GLi and has the same layer structure as that of the gate line GLi. The gate electrode GE and the gate line GLi include the low-reflection material. For instance, the gate electrode GE and the gate line GLi include at least one of titanium, indium zinc oxide, and copper. In addition, the gate electrode GE and the gate line GLi have a multi-layer structure of one or more materials.

An insulating layer IN2 is disposed on the gate electrode GE. The insulating layer IN2 electrically insulates the gate electrode GE from other elements. In the present exemplary embodiment, the insulating layer IN2 serves as a gate insulating layer.

The gate insulating layer IN2 covers the gate electrode GE and the gate line GLi. The gate insulating layer IN2 includes an inorganic material, such as silicon oxide, silicon nitride, etc. The gate insulating layer IN2 may include at least one inorganic material and have a multi-layer structure.

The semiconductor layer AL is disposed on the gate insulating layer IN2. The semiconductor layer AL overlaps the gate electrode GE. An ohmic contact layer (not shown) may bed is posed on the semiconductor layer AL.

The data lines DLj and DLj+1 are disposed on the gate insulating layer IN2. The data lines DLj and DLj+1 include a conductive material. The source electrode SE is connected to the corresponding data line DLj of the data lines DLj and DLj+1. The source electrode SE includes the same material as that of the data lines DLj and DLj+1 and has the same layer structure as that of the data lines DLj and DLj+1.

The drain electrode DE is disposed on the gate insulating layer IN2 and spaced apart from the source electrode SE when viewed in a plan view. A portion of the source electrode SE and a portion of the drain electrode DE overlap a portion of the semiconductor layer AL.

In the present exemplary embodiment, the thin film transistor TFT overlaps the black matrix layer BML. The thin film transistor TFT includes a non-transparent material such as gate metal and a data metal through which the light do not transmit, but the light leakage may occur in the device. The black matrix layer BML extends to overlap the thin film transistor TFT, and thus the occurrence of the light leakage, which is caused by the thin film transistor TFT, may be prevented and display characteristics of the display panel DP may be improved.

An inner layer is disposed on the thin film transistor TFT. The inner layer may comprise an organic layer. The inorganic layer may be further disposed on the thin film transistor TFT. For instance, the organic layer may be an over-coating layer. The over coating layer planarizes an upper surface of the thin film transistor TFT.

The inner layer may serve as a color filter layer CFL. The color filter layer CFL includes at least one color filter. The color filter layer CFL planarizes the upper surface of the thin film transistor TFT and assigns colors to the pixels.

The colors may be changed for every pixel. For instance, the colors include red, green, blue, yellow, magenta, cyan, and white. The color filter layer CFL may have different colors from each other with reference to the data lines DLj and DLj+1, but it should not be limited thereto or thereby. That is, the colors may be overlapping with each other in portions of the peripheral area BA, or the same colors may be disposed adjacent to each other.

Although not shown in figures, the inner layer may further comprise an insulating layer (not sown) which is disposed between the color filter layer CFL and the thin film transistor TFT. In the present exemplary embodiment, the insulating layer serves as a passivation layer to protect the thin film transistor TFT. The passivation layer includes an inorganic layer, e.g., silicon nitride (SiNx), silicon oxide (SiOx), silicon oxy-nitride (SiOxNy). The passivation layer protects the thin film transistor TFT from moisture contained in the color filter layer CFL to expand a life span of the thin film transistor TFT.

The inner layer further comprises an insulating layer IN3 which is disposed on the color filter layer CFL. In the present exemplary embodiment, the insulating layer IN3 serves as a capping layer. The capping layer IN3 prevents organic impurities in the color filter layer CFL from being diffused into a liquid crystal layer.

As shown in FIG. 3B, the pixel electrode PE is disposed on the thin film transistor TFT on the inner layer. The pixel electrode PE is electrically connected to the thin film transistor TFT. The pixel electrode PE is connected to the thin film transistor TFT through a contact hole CH1 formed through the color filter layer CFL and the capping layer IN3. The contact hole CH1 is formed in the area overlapping the black matrix layer BML. According to another embodiment, the pixel electrode PE may be directly connected to the thin film transistor TFT before forming the inner layer. In addition, according to another embodiment, the pixel electrode PE may include a plurality of slits.

The pixel electrode PE includes a transparent conductive material, e.g., indium tin oxide (ITO), indium zinc oxide (IZO), indium gallium oxide (IGO), indium gallium zinc oxide (IGZO), etc. The pixel electrode PE of the transparent conductive material may improve the transmittance of the pixel areas PXA.

The second display substrate DS2 is disposed under the first display substrate DS1. The second display substrate DS2 includes a second base substrate BS2 and a common electrode. The second base substrate BS2 includes the same material as that of the first base substrate BS1, but it should not be limited thereto or thereby.

The common electrode CE is disposed to face the pixel electrode PE. The common electrode CE forms an electric field in cooperation with the pixel electrode PE. The common electrode CE is disposed over the entire surface of the base substrate BS2. Although not shown in figures, a protective layer (not shown) protecting the common electrode CE and an alignment layer (not shown) may be further disposed on the common electrode CE.

As shown in FIG. 3B, since the second display substrate DS2 does not include the color filter layer and the black matrix layer, an organic planarization layer used to planarize an organic layer may be omitted. Accordingly, the common electrode CE makes contact with the second base substrate BS2 or is disposed on the second base substrate BS2 while a separate inorganic layer is disposed between the common electrode CE and the second base substrate BS2.

The common electrode CE has an adhesive strength on the inorganic material, which is higher than the adhesive strength on the organic material. Therefore, moisture or foreign substance is prevented from being penetrated between the common electrode CE and the second base substrate BS2 or between the common electrode CE and the inorganic layer.

Meanwhile, according to another embodiment, the common electrode CE may include the slits. In addition, the common electrode CE may be disposed on the first display substrate DS1 to be spaced apart from the pixel electrode PE rather than the second display substrate DS2.

As shown in FIG. 3B, the liquid crystal layer LC is disposed between the first display substrate DS1 and the second display substrate DS2. The first and second display substrates DS1 and DS2 are spaced apart from each other by a spacer which will be described later. The liquid crystal layer LC is disposed in the space defined by the first and second display substrates DS1 and DS2, which are spaced apart from each other. The liquid crystal layer LC is sealed between the first and second display substrates DS1 and DS2 by a sealing member which will be described later.

The liquid crystal layer LC includes liquid crystal molecules having directors. The directors of the liquid crystal molecules are controlled by the electric field formed between the pixel electrode PE and the common electrode CE.

Although not shown in figures, the liquid crystal layer LC may further include a reactive mesogen. The reactive mesogen includes a material or a compound, which contains a mesogen group with a bar shape, a plate shape, or a disc shape. Polymerization of reactive mesogen with polymerizable group leads to densely cross-linked networks in which the liquid crystalline order is permanently fixed.

The reactive mesogen is polymerized by light, e.g., an ultraviolet light, and the polymerized reactive mesogen may be aligned in accordance with an alignment state of adjacent material thereto. Due to the polymerized reactive mesogen, directivity of the liquid crystal molecules adjacent to the alignment layer is set and a pre-tilt angle of the liquid crystal molecules adjacent to the alignment layer is controlled.

The reactive mesogen improves orientation property of the liquid crystal molecules of the liquid crystal layer LC. The display panel including the reactive mesogen may have improved viewing angle and control the alignment of the liquid crystal molecules according to areas thereof even though domain partitioning members such as protrusions and slits are not formed in the pixel electrode PE or the common electrode CE. Thus, a manufacturing method of the display panel may be simplified and a manufacturing cost of the display panel may be reduced.

According to the display panel DP of the present exemplary embodiment, the black matrix layer BML is buried in the first display substrate DS1 and the common electrode CE is disposed on the second display substrate DS2 without forming the black matrix on the second display substrate. Since the common electrode CE has the transmittance, the polymerization reaction of the reactive mesogen is not degraded even though the light is provided from the lower portion of the second display substrate DS2. According to the present exemplary embodiment, since all the elements used to block the light are disposed on the first display substrate DS1, a curing process using light for the reactive mesogen or the sealing member may be easily performed.

Figure 3C:
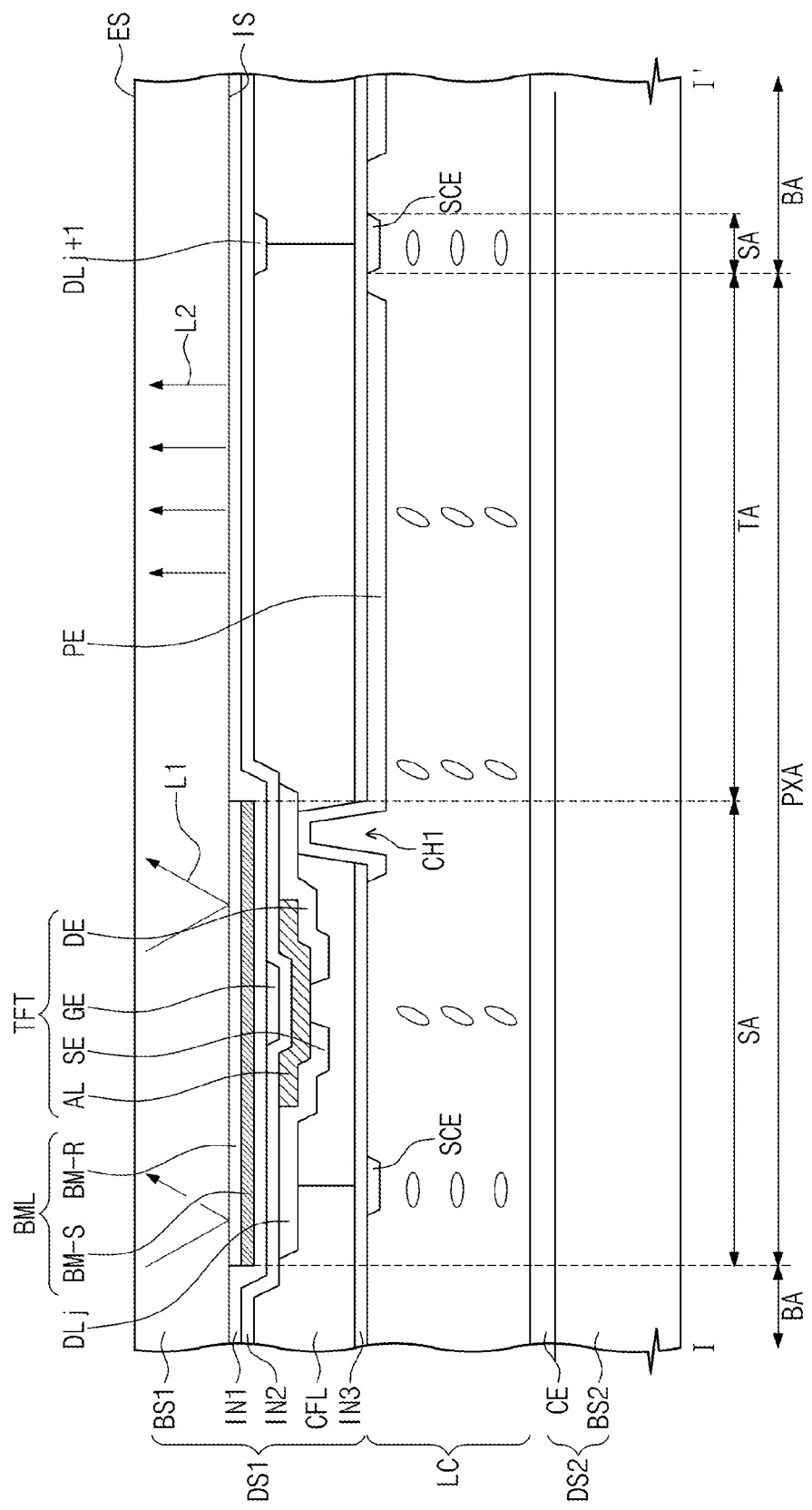
FIG. 3C is a cross-sectional view showing a portion of a display panel according to an exemplary embodiment of the present disclosure.

FIG. 3C is a cross-sectional view showing a portion of a display panel according to an exemplary embodiment of the present disclosure. For the convenience of explanation, FIG. 3C shows the same area as the area shown in FIG. 3B. In FIG. 3C, the same reference numerals denote the same elements in FIGS. 1, 2, 3A, and 3B, and thus detailed descriptions of the same elements will be omitted.

Referring to FIG. 3C, the display panel according to the present exemplary embodiment may further include a light blocking control electrode layer SCE. The light blocking control electrode layer SCE is disposed on the color filter layer CFL and overlapping with the peripheral area BA. In detail, the light blocking control electrode layer SCE extends in the same direction as the data lines DL1 to DLm to overlap with the data lines DL1 to DLm. In this case, the black matrix layer BML may be omitted from the peripheral area BA in which the light blocking control electrode layer SCE is disposed.

As shown in FIG. 3C, the light blocking control electrode SCE controls a portion of the liquid crystal layer LC, which is disposed between the common electrode CE and the light blocking control electrode SCE, to form the light blocking area SA. The liquid crystal molecules of the liquid crystal layer LC are controlled in different directions in accordance with the area overlapping with the pixel electrode PE and the area overlapping with the light blocking control electrode SCE. As described above, the display panel according to the present exemplary embodiment further includes the light blocking control electrode SCE to control the alignment of the liquid crystal molecules in the peripheral area BA, thereby blocking the light traveling to the peripheral area BA.

The light blocking control electrode SCE receives a voltage different from that applied to the pixel electrode PE adjacent thereto. For instance, the light blocking control electrode SCE receives a voltage which may align the liquid crystal layer LC not to transmit the light from the backlight unit. For example, in case of a vertical alignment mode device, the light blocking control electrode SCE receives the same voltage as the common electrode CE. The electric field is not formed between the light blocking control electrode SCE and the common electrode CE, and thus the alignment direction of the liquid crystal molecules of the liquid crystal layer LC is not changed. Accordingly, the light blocking control electrode SCE control the liquid crystal layer LC to maintain a vertical alignment state to ensure the same light blocking function as the black matrix layer BML.

The light blocking control electrode SCE includes a conductive material. The light blocking control electrode SCE may include various conductive materials without being limited to a transparent or non-transparent metal material. For instance, the light blocking control electrode SCE may include the same material as that of the pixel electrode PE. In this case, the light blocking control electrode SCE and the pixel electrode PE may be substantially simultaneously patterned by using the same mask.

Figure 4A:
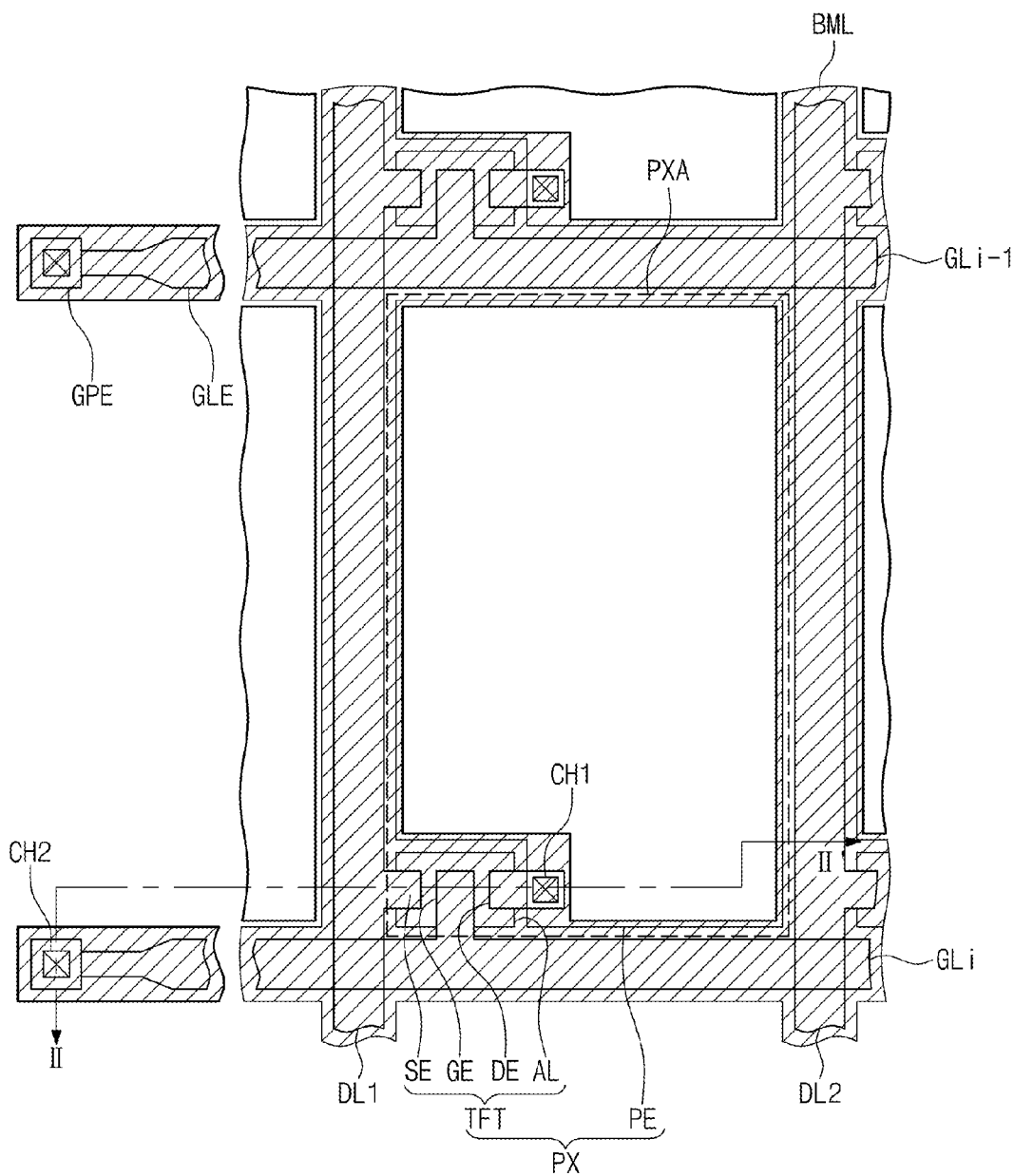
FIG. 4A is a plan view showing a portion of a display panel according to an exemplary embodiment of the present disclosure.
Figure 4B:
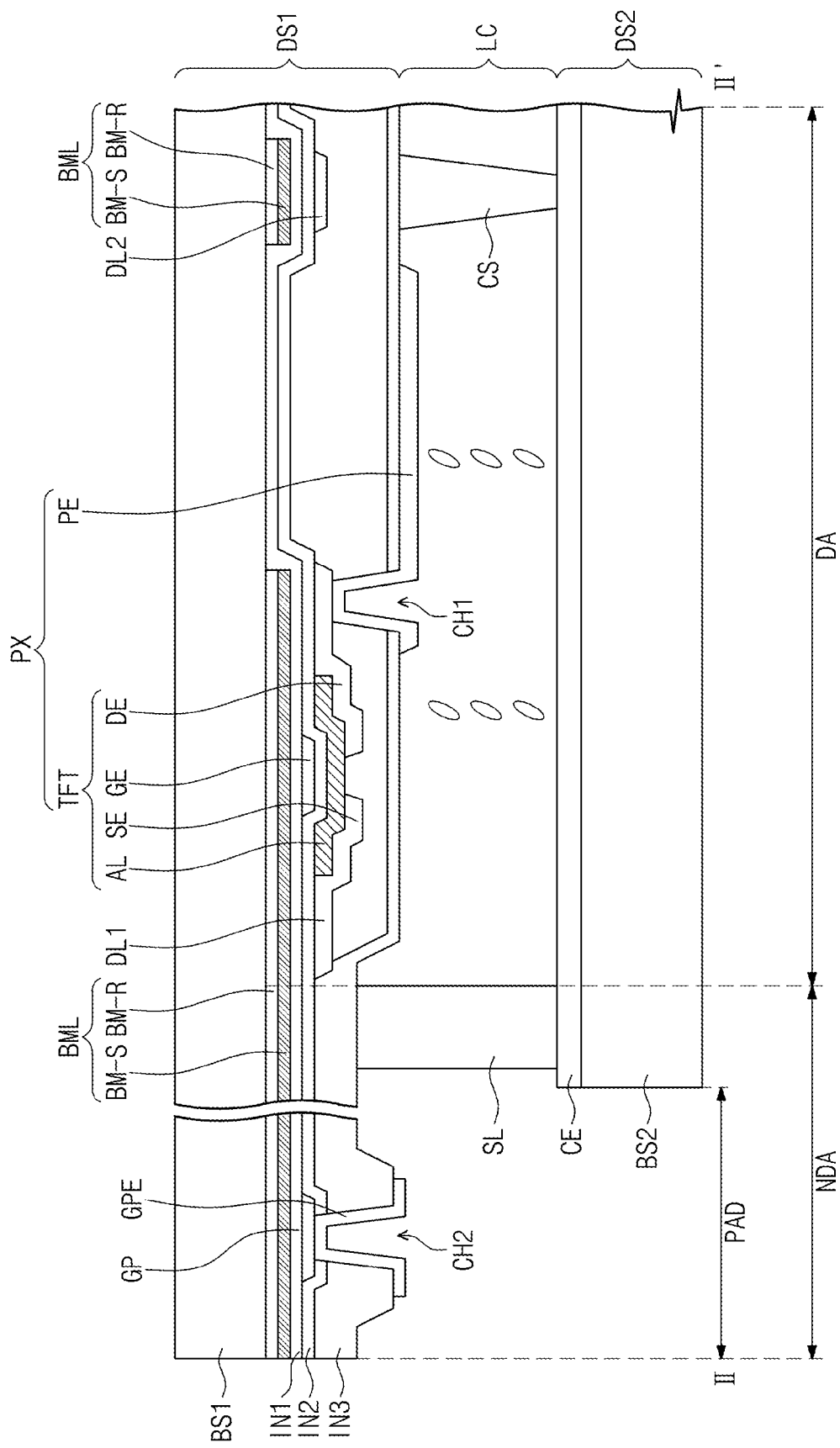
FIG. 4B is a cross-sectional view taken along a line II-II' of FIG. 4A.

FIG. 4A is a plan view showing a portion of a display panel according to an exemplary embodiment of the present disclosure and FIG. 4B is a cross-sectional view taken along a line II-II' of FIG. 4A. In FIGS. 4A and 4B, the same reference numerals denote the same elements in FIGS. 1, 2, 3A, and 3B, and thus detailed descriptions of the same elements will be omitted.

Referring to FIG. 4A, end portions GLE of the gate lines GLi-1 and GLi and pad portions GP are disposed in the pad area PAD. The end portions GLE are formed by elongating the gate lines GLi-1 and GLi disposed in the display area DA to the pad area PAD. The pad portions GP are connected to or directly make contact with a gate pad electrode GPE through contact holes in a one-to-one correspondence. Meanwhile, pad portions of the data lines may be disposed in the pad area PAD instead of the pad portions GP of the gate lines GLi-1 and GLi.

Referring to FIG. 4B, at least one spacer CS is disposed between the first display substrate DS1 and the second display substrate DS2. The spacer CS disposed between the first and second display substrates DS1 and DS2 maintains a cell gap between the first and second display substrates DS1 and DS2.

The spacer CS may overlap one data line DL2 of the data lines DL1, DL2. The black matrix layer BML overlaps the data line DL2 and the spacer CS. Therefore, the black matrix layer BML prevents the light from leaking by the spacer CS.

The spacer CS may contact with the inner layer. Alternatively, one surface of the spacer CS may be attached to the capping layer IN3 or an alignment layer of the first display substrate DS1 and the other surface of the spacer CS, which is opposite to the one surface, makes contact with the common electrode CE. Alternatively, the one surface of the spacer CS may be attached to the color filter layer CFL or the alignment layer when the capping layer IN3 is omitted.

According to another embodiment, the spacer CS may be disposed on the second display substrate DS2. In this case, one surface of the spacer CS is attached to the common electrode CE or an alignment layer, and the other surface of the spacer CS, which is opposite to the one surface, makes contact with the color filter layer CFL, the capping layer IN3, or the alignment layer (not shown) of the first display substrate DS1. Alternatively, the one surface of the spacer CS may be attached to a protective layer covering the common electrode CE.

As shown in FIG. 4B, the sealing member SL is disposed between the first display substrate DS1 and the second display substrate DS2. The sealing member SL is disposed to overlap the non-display area NDA. The first and second display substrates DS1 and DS2 are coupled to each other by the sealing member SL and the liquid crystal layer LC is sealed between the first and second display substrates DS1 and DS2 by the sealing member SL.

The sealing member SL directly makes contact with the common electrode CE or an alignment layer formed on the common electrode CE. In the present exemplary embodiment, since the black matrix layer BML is disposed between the first base substrate BS1 and the thin film transistor TFT, the over-coating layer used to planarize the black matrix layer BML is not exposed on the second base substrate BS2. Therefore, the sealing member SL does not make contact with the over-coating layer on the second base substrate BS2.

Since the sealing member SL has low adhesive strength against the over-coating layer, defects (e.g., delamination) easily occur. In addition, when moisture enters between the sealing member SL and the first and second display substrates DS1 and DS2, the elements disposed inside the display panel DP may be easily damaged. In the present exemplary embodiment, the sealing member SL does not make contact with the over-coating layer, and thus the first display substrate DS1 and the second display substrate DS2 may be securely coupled to each other. As a result, a reliability of the display panel DP may be improved.

Figure 5:
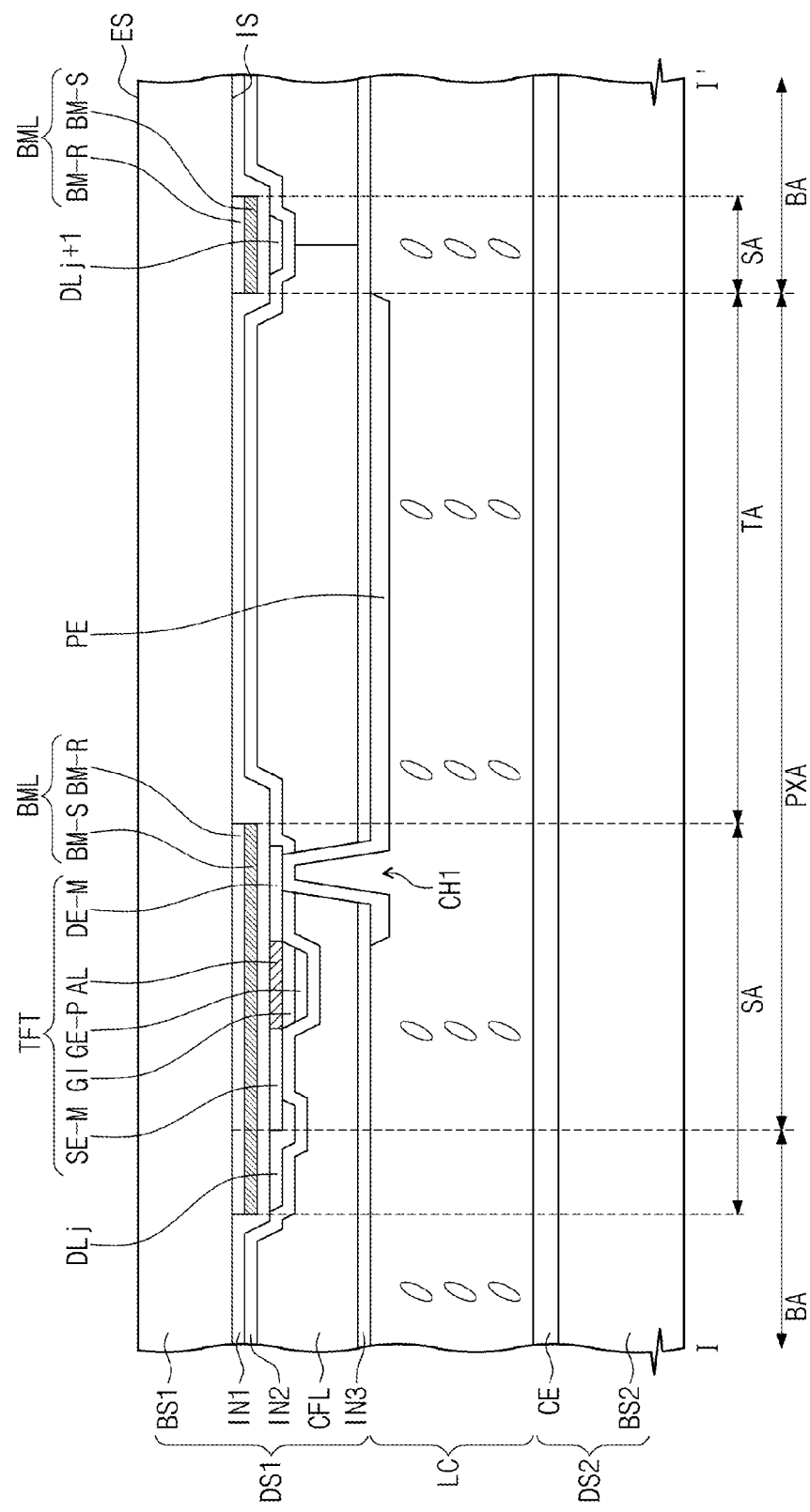
FIG. 5 is a cross-sectional view showing a portion of a display panel according to an exemplary embodiment of the present disclosure.

FIG. 5 is a cross-sectional view showing a portion of a display panel according to an exemplary embodiment of the present disclosure. FIG. 5 shows the thin film transistor TFT including the oxide semiconductor. In FIG. 5, the same reference numerals denote the same elements in FIGS. 1, 2, 3A and 3B, and 4A and 4B, and thus detailed descriptions of the same elements will be omitted.

Referring to FIG. 5, the oxide semiconductor is disposed on the insulating layer IN1 that covers the black matrix layer BML. The insulating layer IN1 may be a buffer layer. The buffer layer IN1 includes insulating oxide material, e.g., silicon oxide (SiOx), aluminum oxide ($Al_2O_3$), hafnium oxide ($HfO_3$), yttrium oxide ($Y_2O_3$), etc. The buffer layer IN1 prevents impurities from entering into the semiconductor layer formed later to protect the semiconductor layer and improve an interface characteristic of the semiconductor layer. The buffer layer may be separately provided on the insulating layer IN1.

The semiconductor layer is disposed on the insulating layer IN1. The semiconductor layer includes the oxide semiconductor. For instance, the oxide semiconductor includes a metal oxide semiconductor. The semiconductor layer may include at least one of zinc (Zn), indium (In), gallium (Ga), tin (Sn), titanium (Ti). In detail, the semiconductor layer includes at least one of zinc oxide (ZnO), zinc-tin oxide (ZTO), zinc indium oxide (ZIO), indium oxide (InO), titanium oxide (TiO), indium gallium zinc oxide (IGZO), and indium zinc tin oxide (IZTO).

The semiconductor layer includes a channel area AL, a source area SE-M, and a drain area DE-M. The source area SE-M and the drain area DE-M are disposed at both ends of the channel area AL, respectively. A channel area AL is disposed between the source area SE-M and the drain area DE-M.

The source area SE-M and the drain area DE-M include the same material as that of the semiconductor layer and the channel area AL or a material reduced from the semiconductor layer and the channel area AL. A metal layer precipitated from the metal material included in the semiconductor layer and the channel area AL may be disposed on surfaces of the source area SE-M and the drain area DE-M.

The source area SE-M is directly connected to a portion extending from the data line DLj to receive a data voltage. Alternatively, the source area SE-M is connected to the data line DLj through a contact hole (not shown).

The drain electrode DE-M is connected to the pixel electrode PE. The drain electrode DE-M is connected to the pixel electrode PE through a contact hole CH1. Although not shown in figures, the display panel may further include an input electrode and an output electrode, which are respectively connected to the source area SE-M and the drain area DE-M.

The insulating layer GI is disposed on the semiconductor layer including the source area SE-M, the drain area DE-M, and the channel area AL. The insulating layer GI covers at least the channel area AL. The insulating layer GI extends to a portion of the source area SE-M, which is connected to the channel area AL, and a portion of the drain area DE-M, which is connected to the channel area AL.

The insulating layer GI prevents impurities from penetrating into the channel area AL and improves the interface characteristic of the channel area AL. The insulating layer GI has a single-layer structure or a multi-layer structure. The insulating layer GI includes insulating oxide material, e.g., silicon oxide (SiOx), aluminum oxide ($Al_2O_3$), hafnium oxide ($HfO_3$), yttrium oxide ($Y_2O_3$), etc.

A gate electrode pattern GE-P is disposed on the insulating layer GI. A side surface of the gate electrode pattern GE-P is aligned with a side surface of the insulating layer GI. The gate electrode pattern GE-P may be used as a mask that determines a width of the channel area AL. The gate electrode pattern GE-P does not overlap the source area SE-M and the drain area DE-M, and thus a parasitic capacitance occurring between the gate electrode and the source area SE-M or the drain area DE-M may be reduced.

The gate electrode pattern GE-P includes aluminum (Al), silver (Ag), copper (Cu), molybdenum (Mo), chromium (Cr), tantalum (Ta), titanium (Ti), or an alloy thereof. The gate electrode GE has a single-layer structure or a multi-layer structure. For instance, the gate electrode GE has a double-layer structure of a lower layer including titanium (Ti), tantalum (Ta), molybdenum (Mo), or indium tin oxide (ITO) and an upper layer including copper (Cu), or a triple-layer structure of molybdenum (Mo)-aluminum (Al)-molybdenum (Mo), but it should not be limited thereto or thereby.

The insulating layer IN2 is disposed on the gate electrode pattern GE-P. The insulating layer IN2 may be the passivation layer to cover the thin film transistor TFT. The passivation layer IN2 protects the thin film transistor TFT from other elements and covers the data lines DLj and DLj+1.

The internal light traveling to the first display substrate DS1 after passing through the second display substrate DS2 may influence on the thin film transistor TFT. For instance, when a photocurrent is formed in the semiconductor layer including the oxide semiconductor by the internal light, the thin film transistor TFT is abnormally driven. However, according to the display panel in the present exemplary embodiment, the gate electrode GE acts as the light blocking portion to block the internal light. Therefore, the channel area AL is protected from the internal light and the characteristics of the thin film transistor TFT is maintained even though a separate light blocking layer, such as the black matrix layer, is not disposed on the second display substrate DS2.

Figure 6:
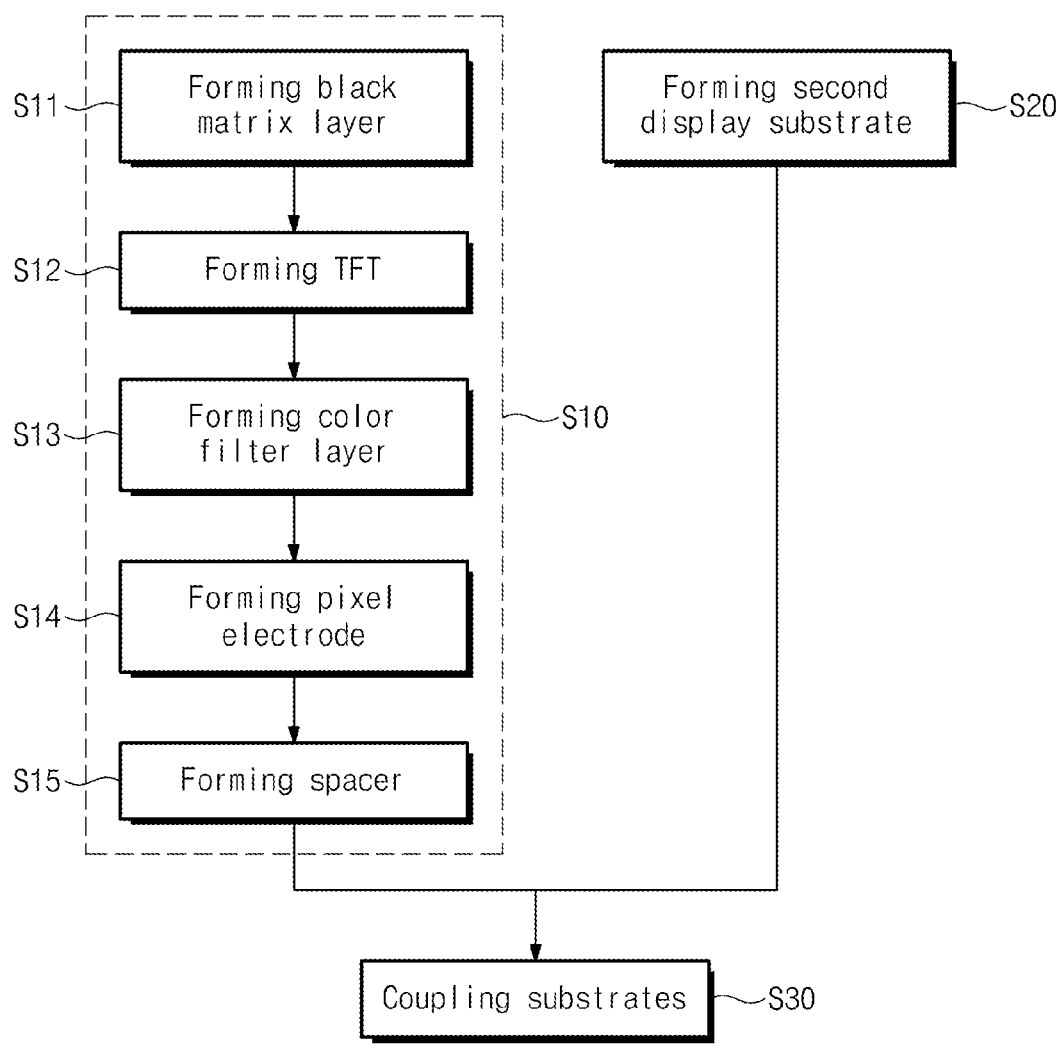
FIG. 6 is a flowchart showing a manufacturing method of a display panel according to an exemplary embodiment of the present disclosure.

FIG. 6 is a flowchart showing a manufacturing method of the display panel according to an exemplary embodiment of the present disclosure.

Referring to FIG. 6, the manufacturing method of the display panel includes forming the first display substrate (S10), forming the second display substrate (S20), and coupling the first and second display substrates (S30).

The forming of the first display substrate (S10) includes forming the black matrix on the substrate BS1 (S11), forming the thin film transistor (S12), forming the color filter layer (S13), forming the pixel electrode (S14), and forming the spacer (S15).

The forming of the second display substrate (S20) includes forming the common electrode on the substrate. However, according to another embodiment, the forming of the spacer (S15) may be included in the forming of the second display substrate (S20).

After the first and second display substrates are formed, the first and second display substrates are coupled to each other to form the display panel (S30). In this case, the first and second display substrates are coupled to each other such that the elements formed on the first display substrate are disposed between the first and second display substrates.

FIGS. 7A to 7I are cross-sectional views showing the manufacturing method of the display panel according to an exemplary embodiment of the present disclosure.

Figure 7A:
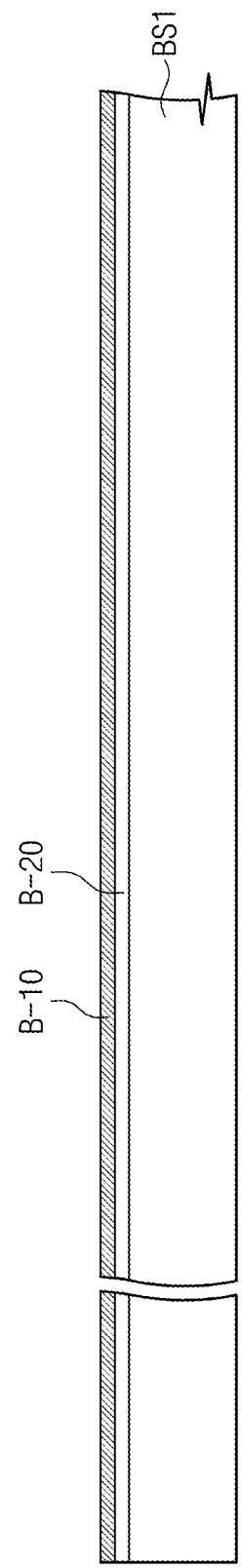
FIGS. 7A to 7I are cross-sectional views showing a manufacturing method of a display panel according to an exemplary embodiment of the present disclosure.

The forming of the black matrix (S11) will be described with reference to FIGS. 7A to 7C. Referring to FIG. 7A, a second layer B-20 including the metal material and a first layer B-10 including the low reflection material are sequentially formed on the surface of the first base substrate BS1.

The first base substrate BS1 includes the display area DA and the non-display area NDA surrounding the display area DA. The display area DA includes at least one pixel area PXA and the peripheral area BA disposed adjacent to the pixel area PXA when viewed in a plan view. The pixel area PXA includes the pixel disposed therein.

The low reflection material is determined depending on the metal material included in the second layer B-20. In the present exemplary embodiment, the metal material includes copper, chromium, or titanium and the low reflection material includes at least one of indium, zinc, gallium, and metal oxide. Although not shown in figures, the first layer B-10 has a thickness depending on the metal material included in the second layer B-20.

Figure 7B:
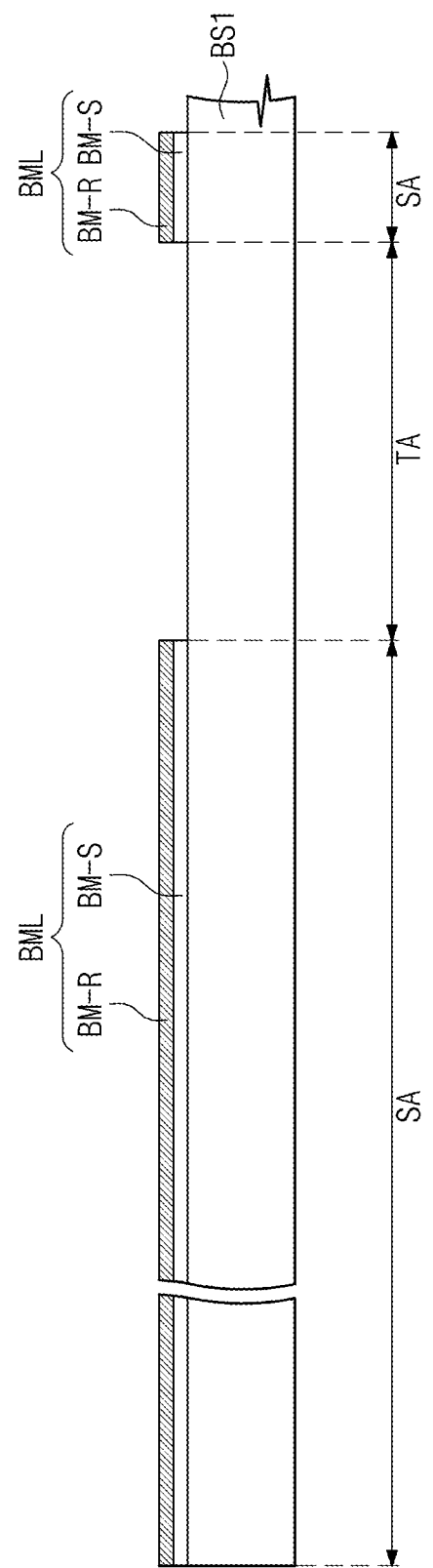

Referring to FIG. 7B, the first layer B-10 and the second layer B-20 are patterned to form the black matrix layer BML. The first and second layers B-10 and B-20 may be substantially simultaneously patterned to overlap the peripheral area BA. However, the first and second layers B-10 and B-20 may be patterned such that a portion of the black matrix BML extends to a portion of the pixel area PXA.

Figure 7C:
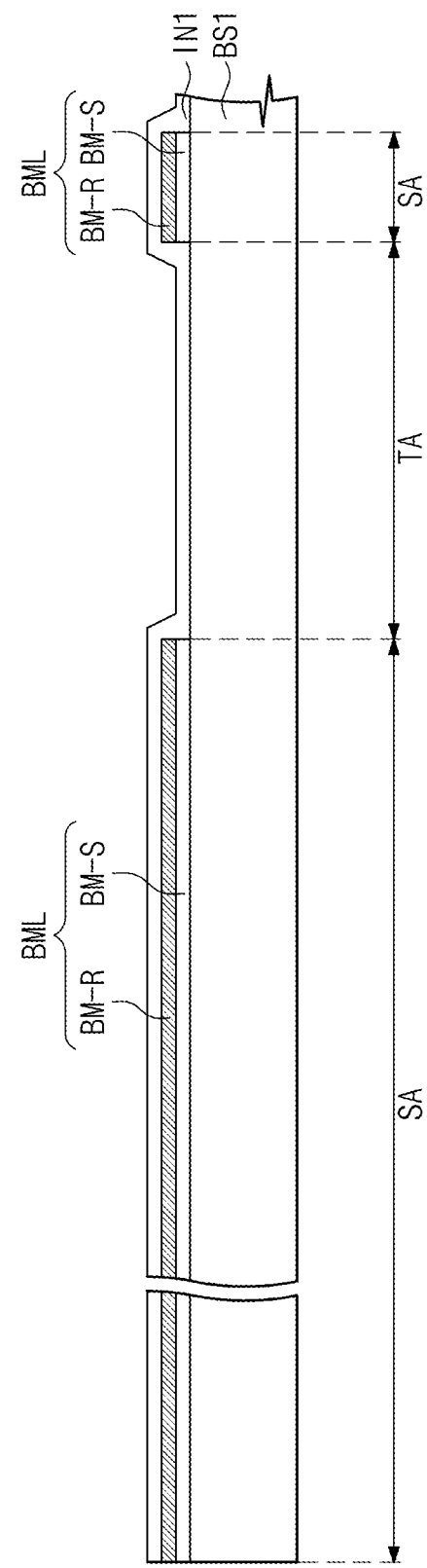

Referring to FIG. 7C, the insulating layer IN1 is formed on the black matrix layer BML. The insulating layer IN1 protects the black matrix BML. In addition, the insulating layer IN1 insulates the black matrix layer BML having the conductivity from other elements.

Figure 7D:
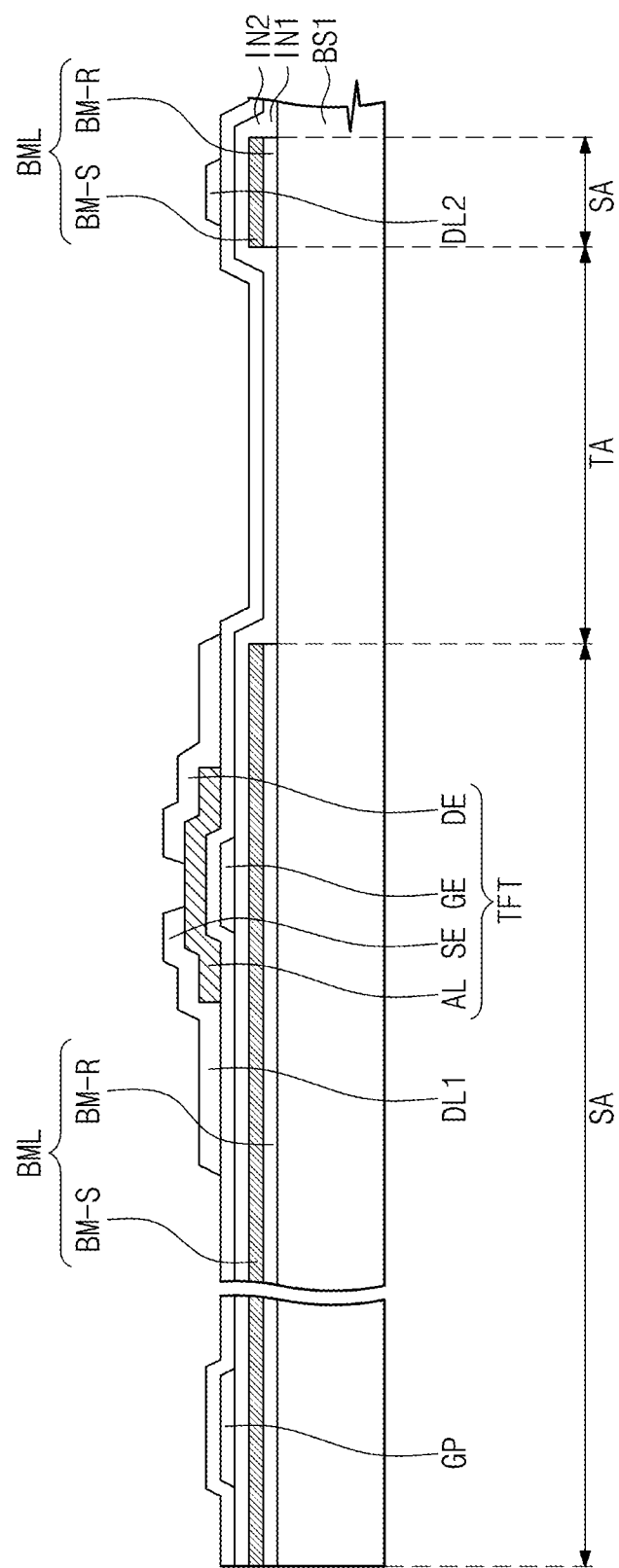

FIG. 7D shows the forming of the thin film transistor (S12). Referring to FIG. 7D, the thin film transistor TFT is formed on the black matrix layer BML. The signal lines applied with a first signal are formed on the black matrix layer. The signal lines correspond to the gate lines extending in the first direction and arranged in the second direction.

The gate lines are disposed to overlap the peripheral area BA. One ends of the gate lines extend in the non-display area NDA to form the pad portions GP. The pad portions GP overlaps the pad area PAD.

As shown in FIG. 7D, the gate electrode GE is formed on the insulating layer IN1. The gate electrode GE is connected to the corresponding gate line of the gate lines. The gate electrode GE may be formed together with the gate line.

The semiconductor layer AL and the source/drain electrodes are sequentially formed on the gate electrode GE. The gate electrode GE, the semiconductor layer AL, and the source/drain electrodes form the thin film transistor TFT. The insulating layer IN2 may be further disposed between the gate electrode GE and the semiconductor layer AL. The insulating layer IN2 covers the gate electrode GE, the gate line (not shown), and the gate pad portion GP.

A center portion of the semiconductor layer AL overlaps the gate electrode GE. The source electrode SE and the drain electrode DE spaced apart from the source electrode SE are formed on the semiconductor layer AL. The portions of the source electrode SE and the drain electrode DE are disposed to overlap the semiconductor layer AL and the gate electrode GE.

In this case, the signal lines are formed on the insulating layer IN2. The signal lines receive a second signal different from the first signal. The signal lines correspond to the data lines extending in the second direction crossing the first direction. The data lines are arranged to be spaced apart from each other.

The data lines DL1 and DL2 are formed to overlap the peripheral area BA. The source electrode SE is electrically connected to the data line. The source electrode SE, the drain electrode DE, and the data lines DL1 and DL2 may be formed together with each other. In the present exemplary embodiment, the black matrix layer BML extends to overlap the thin film transistor TFT.

Figure 7E:
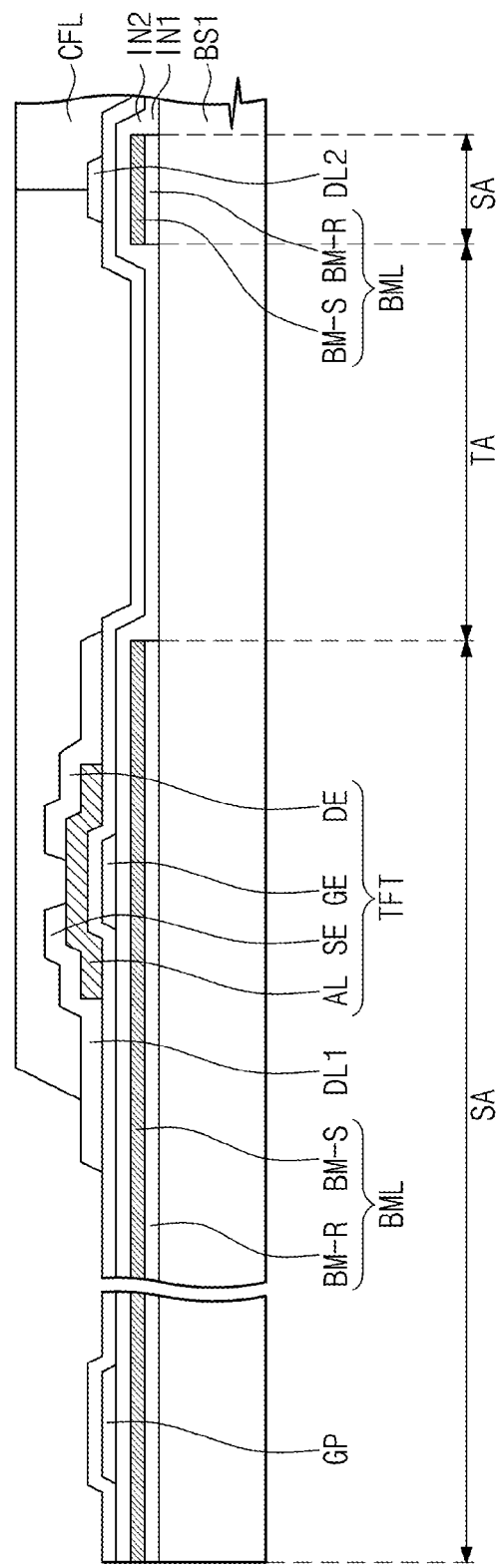

FIG. 7E shows the forming of the color filter layer (S13). Referring to FIG. 7E, the color filter layer CFL overlaps at least the pixel area and extends to the peripheral area BA. The color filter layer CFL covers the thin film transistor TFT. The color filter layer CFL displays different colors in accordance with the pixels. Different colors may be overlapping with each other in the peripheral area BA overlapping with the light blocking area SA.

Figure 7F:
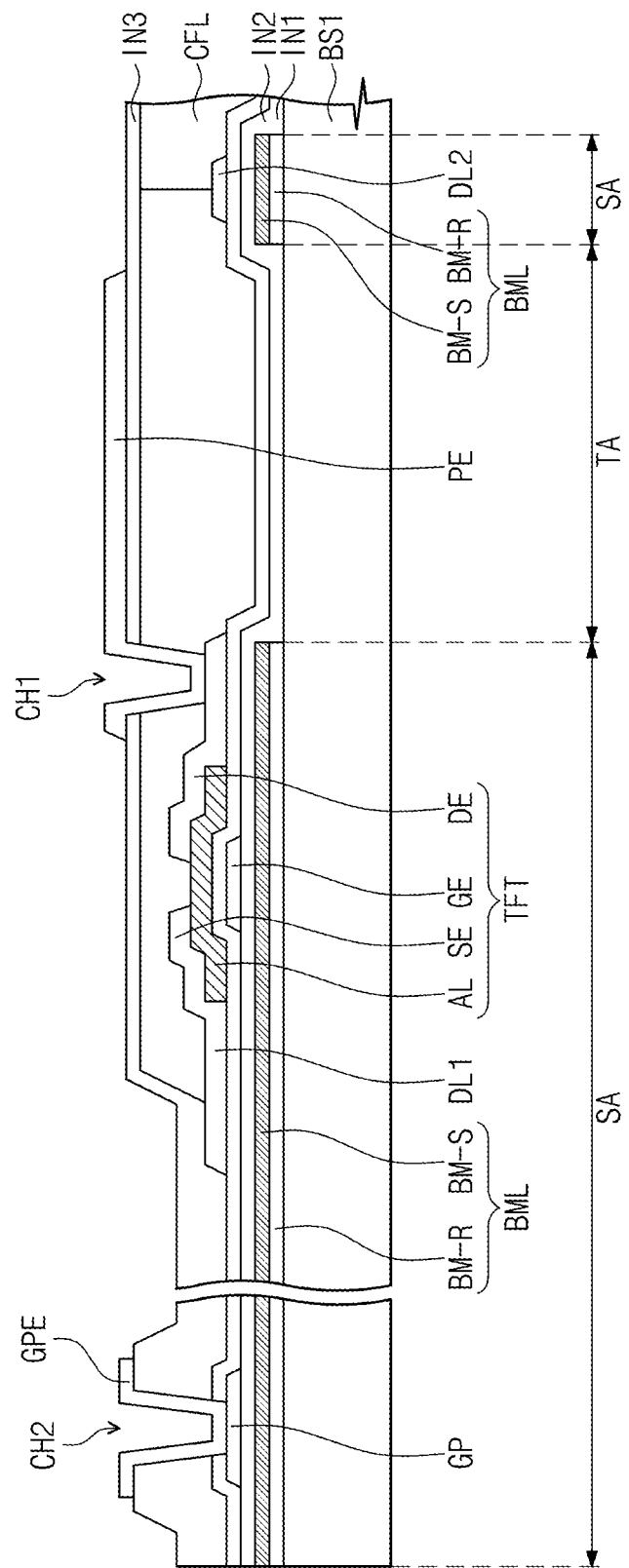

FIG. 7F shows the forming of the pixel electrode (S14). Referring to FIG. 7F, the pixel electrode PE is formed on the color filter layer CFL. The pixel electrode PE is disposed to overlap the transmitting area TA. Although not shown in figures, the pixel electrode PE may include the slits formed therein.

The contact hole CH1 is formed through the insulating layer IN3 and the color filter layer CFL. The portion of the drain electrode DE is exposed through the contact hole CH1. The portion of the pixel electrode PE extends and is electrically connected to the exposed drain electrode DE through the contact hole CH1.

When the contact hole CH1 is formed, the contact hole CH2 is formed through the insulating layer IN3 extending to the gate pad portion GP. The upper surface of the gate pad portion GP is exposed through the contact hole CH2. The exposed gate pad part GP is connected to a gate pad electrode GPE. The gate pad electrode GPE is substantially simultaneously patterned with the pixel electrode PE. An alignment layer (not shown) may be formed on the pixel electrode PE.

Figure 7G:
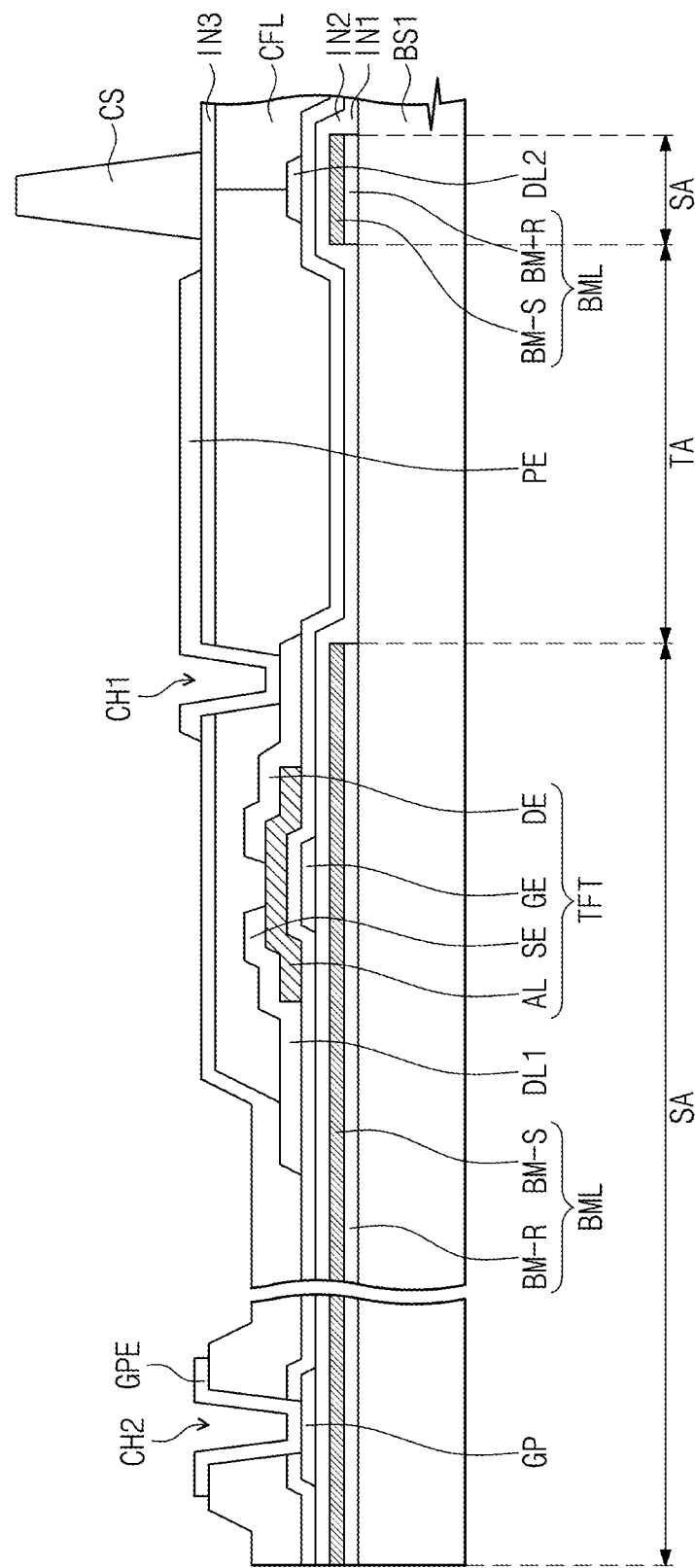

FIG. 7G shows the forming of the spacer (S15). Referring to FIG. 7G, at least one spacer CS is formed on the color filter CFL, the insulating layer IN3 or the alignment layer formed on the pixel electrode PE. The spacer CS is formed by patterning the insulating material.

The spacer CS is formed in the peripheral area BA and overlaps the light blocking area SA. The spacer CS is attached to the color filter layer CFL, the insulating layer IN3 or the alignment layer formed on the pixel electrode PE. The spacer CS has the height corresponding to the cell gap of the display panel.

Figure 7H:
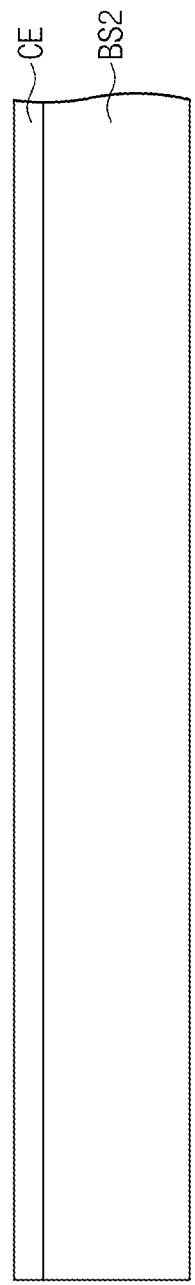

FIG. 7H shows the forming of the second display substrate (S20). Referring to FIG. 7H, the common electrode CE is formed on the upper surface of the second base substrate BS2. An alignment layer (not shown) may be formed on the common electrode CE. Since the first display substrate DS1 includes the spacer CS formed thereon, the forming process of the second display substrate (S20) may be simplified.

The common electrode CE is formed over the entire surface of the second base substrate BS2. However, according to another embodiment, the common electrode CE may be partially patterned to correspond to the pixel electrode PE, or the common electrode CE may include the slits formed therein.

Although not shown in figures, according to another embodiment, the forming of the second display substrate S20 may further include the forming of the spacer CS. In this case, the spacer CS is disposed on the common electrode CE and attached to the second display substrate DS2.

Although not shown in figures, according to another embodiment, the forming of the common electrode CE may be included in the forming of the first display substrate (S10).

Figure 7I:
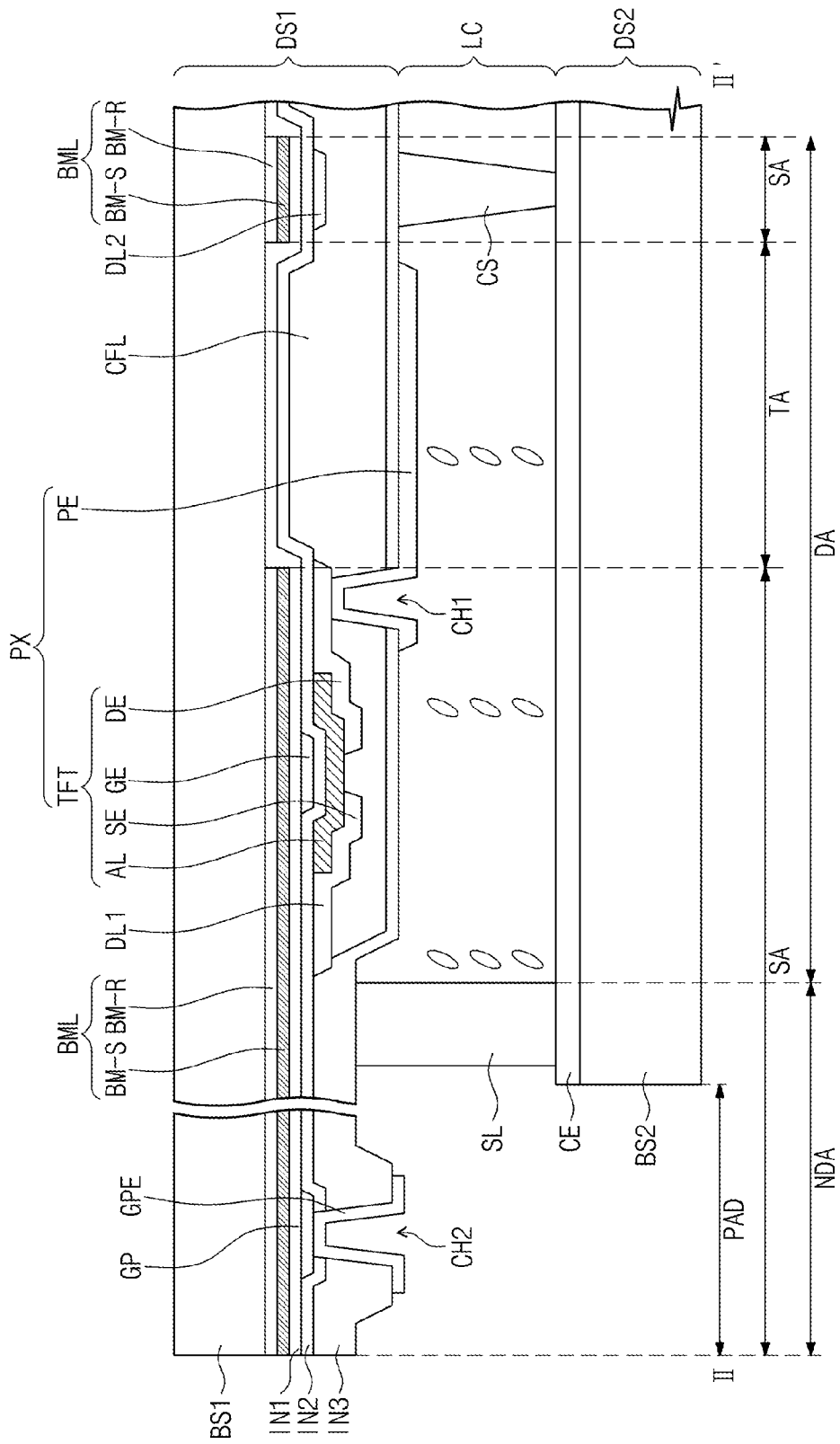

FIG. 7I shows the coupling of the first and second display substrates (S30). Referring to FIG. 7I, the first display substrate DS1 is disposed above the second display substrate DS2. The first display substrate DS1 is disposed to allow the surface of the first base substrate BS1 to face the upper surface of the second base substrate BS2.

The sealing member SL is disposed between the first display substrate DS1 and the second display substrate DS2. The sealing member SL is formed by coating a curable adhesive material between the first display substrate DS1 and the second display substrate DS2 and irradiating a light to the curable adhesive material. In this case, since the black matrix layer BML does not exist on the second display substrate DS2, the light irradiated onto the lower surface of the second display substrate DS2 transmits through the second display substrate DS2, thereby easily curing the sealing member SL.

The liquid crystal molecules are injected between the first display substrate DS1 and the second display substrate DS2, which are coupled to each other, to form the liquid crystal layer LC. The liquid crystal molecules of the liquid crystal layer LC may be pre-tilted in accordance with the operation mode of the liquid crystal layer LC.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed.

What is claimed is:

1. A display panel comprising:
    a first base substrate that includes an upper surface to which an external light is incident and a lower surface facing the upper surface and includes a plurality of pixel areas and a peripheral area adjacent to the pixel areas when viewed in a plan view;
    a plurality of pixels disposed on the lower surface of the first base substrate to respectively correspond to the pixel areas; and
    a black matrix layer disposed between the pixels and the lower surface of the first base substrate to overlap the peripheral area, the black matrix layer comprising a low reflection layer disposed on the lower surface of the first base substrate and a light blocking layer disposed on the low reflection layer, the light blocking layer comprising a metal material.

2. The display panel of claim 1, wherein the black matrix layer has a reflectivity of about 1.8% to about 3.8% with respect to the external light.

3. The display panel of claim 1, wherein the low reflection layer comprises a metal oxide obtained from the metal material included in the light blocking layer.

4. The display panel of claim 3, wherein the light blocking layer comprises chromium and the low reflection layer comprises a chromium oxide.

5. The display panel of claim 1, wherein the light blocking layer comprises copper or titanium and the low reflection layer comprises at least one of indium oxide, gallium oxide, zinc oxide, and any combination thereof.

6. The display panel of claim 1, further comprising a plurality of signal lines disposed in the peripheral area, wherein each of the pixels comprises:
    a thin film transistor connected to a corresponding signal line of the signal lines; and
    a pixel electrode connected to the thin film transistor through a contact hole formed through an inner layer that covers the thin film transistor and the black matrix layer further overlaps with the thin film transistor.

7. The display panel of claim 6, further comprising:
    a second base substrate disposed to be spaced apart from the lower surface of the first base substrate; and
    a common electrode disposed directly on the second base substrate.

8. The display panel of claim 7, further comprising:
    a second base substrate disposed to be spaced apart from the lower surface of the first base substrate;
    a common electrode disposed on the second base substrate; and
    an interlayer disposed between the second base substrate and the common electrode, the interlayer having an inorganic material,
    wherein the common electrode is directly disposed on the interlayer.

9. The display panel of claim 8, further comprising at least one spacer, wherein the first base substrate comprises:
    a display area that includes the pixel areas and the peripheral area; and
    a non-display area surrounding the display area,
    wherein the spacer is disposed between the first base substrate and the second base substrate to overlap with the peripheral area, attached to the inner layer, and makes contact with the common electrode.

10. The display panel of claim 9, wherein the inner layer comprises a color filter layer.

11. The display panel of claim 9, further comprising:
a liquid crystal layer disposed between the first base substrate and the second base substrate; and
a sealing member disposed to overlap with the non-display area, to couple the first base substrate and the second base substrate, and to seal the liquid crystal layer,
wherein the inner layer comprises a color filter layer and an insulating layer which is disposed between the color filter layer and the pixel electrode.

12. The display panel of claim 11, further comprising a light blocking control electrode disposed on the inner layer to overlap with the peripheral area, receiving a same voltage as the common electrode, and controlling an alignment of liquid crystal molecules of the liquid crystal layer, which are disposed in the peripheral area, to define a light blocking area.

13. The display panel of claim 12, wherein the light blocking control electrode comprises a same material as that of the pixel electrode.

14. The display panel of claim 12, wherein the signal lines comprise:
a plurality of gate lines each of which is connected to a gate electrode of a corresponding thin film transistor; and
a plurality of data lines each of which is connected to a source electrode of a corresponding thin film transistor, and the light blocking control electrode overlaps the data lines.

15. The display panel of claim 7, further comprising a light blocking control electrode disposed on the inner layer to overlap peripheral area, the light blocking control electrode receiving a same voltage as the common electrode to define a light blocking area.

16. The display panel of claim 15, wherein the light blocking control electrode includes a material same as a material which the pixel electrode includes.

\* \* \* \* \*